US012446393B2

(12) United States Patent
Lee et al.

(10) Patent No.: US 12,446,393 B2
(45) Date of Patent: Oct. 14, 2025

(54) LIGHT-EMITTING DIODE COMPRISING PEROVSKITE LIGHT-EMITTING LAYER HAVING LAYERED STRUCTURE, AND METHOD OF PRODUCING SAME

(71) Applicant: SEOUL NATIONAL UNIVERSITY R&DB FOUNDATION, Seoul (KR)

(72) Inventors: Tae-Woo Lee, Seoul (KR); Young-Hoon Kim, Seoul (KR)

(73) Assignee: SEOUL NATIONAL UNIVERSITY R&DB FOUNDATION (KR)

( * ) Notice: Subject to any disclaimer, the term of this patent is extended or adjusted under 35 U.S.C. 154(b) by 889 days.

(21) Appl. No.: 17/437,414

(22) PCT Filed: Dec. 31, 2019

(86) PCT No.: PCT/KR2019/018760
§ 371 (c)(1),
(2) Date: May 9, 2022

(87) PCT Pub. No.: WO2020/184825
PCT Pub. Date: Sep. 17, 2020

(65) Prior Publication Data
US 2022/0393128 A1    Dec. 8, 2022

(30) Foreign Application Priority Data
Mar. 8, 2019    (KR) .................. 10-2019-0027114

(51) Int. Cl.
*H10K 50/11*    (2023.01)
*H10K 71/00*    (2023.01)
(Continued)

(52) U.S. Cl.
CPC ............. *H10K 50/11* (2023.02); *H10K 71/00* (2023.02); *H10K 85/50* (2023.02); *H10K 71/441* (2023.02);
(Continued)

(58) Field of Classification Search
CPC .... H10K 50/11; H10K 71/00; H10K 2101/40; H10K 2102/351; H10K 85/1135;
(Continued)

(56) References Cited

U.S. PATENT DOCUMENTS 8,829,555 B2 * 9/2014 Kamei .................... H01L 33/42
257/E33.064
2007/0024188 A1 * 2/2007 Kim ....................... H10K 50/11
313/504
(Continued)

FOREIGN PATENT DOCUMENTS

JP    2011009498 A    1/2011
KR   20160127447 A   11/2016
(Continued)

OTHER PUBLICATIONS

Wang et al., Perovskite Optoelectronic Device, Manufacturing Method and Perovskite Material (Year: 2018).*
(Continued)

*Primary Examiner* — Tu-Tu V Ho
(74) *Attorney, Agent, or Firm* — Renaissance IP Law Group LLP

(57) ABSTRACT

The present invention relates to a light emitting device including a light emitting layer having a stacked structure of two or more layers in which the light emitting layer is alternately disposed with a first light emitting material layer and a second light emitting material layer. In addition, the light-emitting material layer is a perovskite layer or an organic material layer, the first light-emitting material layer and the second light-emitting material layer are characterized in that they have different band gaps. By alternately disposing the first light emitting material layer and the second light emitting material layer to have a stacked structure and by controlling the energy level, there is an advantage in that the electroluminescence efficiency can be (Continued)

improved by controlling the electron-hole recombination region of the light emitting device. In addition, there is an advantage that a white light emitting device can be manufactured by controlling the energy levels of the first light emitting material layer and the second light emitting material layer.

12 Claims, 5 Drawing Sheets

(51) Int. Cl.
*H10K 85/50* (2023.01)
*H10K 71/40* (2023.01)
*H10K 85/10* (2023.01)
*H10K 85/30* (2023.01)
*H10K 85/60* (2023.01)
*H10K 101/40* (2023.01)
*H10K 102/00* (2023.01)

(52) U.S. Cl.
CPC ........ *H10K 85/111* (2023.02); *H10K 85/1135* (2023.02); *H10K 85/30* (2023.02); *H10K 85/657* (2023.02); *H10K 85/6572* (2023.02); *H10K 2101/40* (2023.02); *H10K 2102/351* (2023.02)

(58) Field of Classification Search
CPC .... H10K 85/657; H10K 85/30; H10K 85/111; H10K 85/6572
USPC .......................................................... 257/40
See application file for complete search history.

(56) References Cited

U.S. PATENT DOCUMENTS

| | | | |
|---|---|---|---|
| 2010/0006873 A1* | 1/2010 | Raring | H01L 27/153 257/E33.056 |
| 2011/0303904 A1* | 12/2011 | Avasthi | H10K 30/353 257/E51.026 |
| 2020/0220094 A1* | 7/2020 | Matsushima | H10K 50/12 |
| 2021/0148004 A1* | 5/2021 | Lunt, III | C23C 14/0694 |
| 2021/0399246 A1* | 12/2021 | Snaith | H10K 30/211 |

FOREIGN PATENT DOCUMENTS

| | | |
|---|---|---|
| KR | 20170050693 A | 5/2017 |
| KR | 20180040502 A | 4/2018 |
| KR | 20180093991 A | 8/2018 |

OTHER PUBLICATIONS

International Search Report for PCT/KR2019/018760 mailed Apr. 21, 2020.

* cited by examiner

LIGHT-EMITTING DIODE COMPRISING PEROVSKITE LIGHT-EMITTING LAYER HAVING LAYERED STRUCTURE, AND METHOD OF PRODUCING SAME

TECHNICAL FIELD

The present disclosure relates to light-emitting device having multi-layered perovskite light-emitting layer and Method of fabricating the same.

BACKGROUND ART

The current megatrend in the display market is moving from the existing high-efficiency, high-resolution displays to emotional quality displays that aims to achieve high-color purity and natural colors. From this point of view, the current organic light-emitting-diode (OLED) device based on an organic small-molecule light emitter has made a leap forward, and an inorganic quantum dot LED with improved color purity is being actively researched and developed as another alternative. However, both the organic small molecule light emitter and the inorganic quantum dot light emitters have inherent limitations in terms of materials.

Existing organic small-molecule light emitters have the advantage of high efficiency, but their color purity is poor due to a wide emission spectrum. Although the inorganic quantum dot light-emitters have been known to have good color purity, but since the luminescence occurs by the quantum size effects, there is a problem that it is difficult to uniformly control the sizes of the quantum dots as the emission color approaches the high energy, and thereby the size distribution deteriorates the color purity. In addition, the organic small-molecule light emitters and the inorganic quantum dot light emitters have a disadvantage of being expensive. Accordingly, there is a need for a new type of organic-inorganic hybrid light emitters that compensates for the shortcomings of the organic light emitters and the inorganic quantum dot emitters and still maintains their advantages.

Metal halide perovskite materials are in the spotlight academically and industrially because they are very inexpensive to manufacture, have simple manufacturing and device manufacturing processes, have various optical and electrical properties through composition control, and have high charge mobility. In particular, the metal halide perovskite material has high photoluminescence quantum efficiency, high color purity, and simple color control, and thus has very excellent properties as a light emitter.

A material having a conventional perovskite structure ($ABX_3$) is an inorganic metal oxide.

These inorganic metal oxides are generally oxides, and cations of metals such as Ti, Sr, Ca, Cs, Ba, Y, Gd, La, Fe, and Mn having different sizes (alkali metals, alkaline earth metals, transition metals, and lanthanum groups, etc.) are located at the A and B sites, and oxygen anions are located at the X site, and the metal cations at the B site are 6-fold coordination with the oxygen anions at the X site. It is a material that is bound in the form of a corner-sharing octahedron. Examples thereof include $SrFeO_3$, $LaMnO_3$, and $CaFeO_3$.

In contrast, metal halide perovskite has an organic ammonium ($RNH_3$) cation, an organic phosphonium ($RPH_3$) cation or alkali metal cation located at the A site in the $ABX_3$ structure, and a halide anion ($Cl^-$, $Br^-$, $I^-$) at the X site. As a result, a metal halide perovskite material is formed, so the composition is completely different from that of the inorganic metal oxide perovskite material.

In addition, the properties of the material are also changed according to the difference between these constituent materials. Inorganic metal oxide perovskite typically exhibits properties such as superconductivity, ferroelectricity, and colossal magnetoresistance, and therefore, research has been generally applied to sensors, fuel cells, and memory devices. As an example, yttrium barium copper oxide has superconducting or insulating properties depending on the oxygen contents.

On the other hand, since metal halide perovskite has high absorption coefficient, high photoluminescence quantum efficiency, high color purity (full width at half maximum ≤20 nm) determined by the crystal structure rather than the size of the material, metal halide perovskite has been used as a light emitters or/and light absorbers.

If the organic-inorganic-hybrid perovskite has a chromophore (mainly including a conjugated structure) in which organic ammonium (or "A site cation" in perovskite crystals) has a bandgap less than that of an octahedron crystal structure composed of a central metal and a inorganic crystal structure ($BX_6$), the luminescence occurs in the organic ammonium. Thus, since light having high color purity is not emitted, a full width at half maximum of the luminescence spectrum becomes wider than 100 nm. Therefore, the organic-inorganic-hybrid perovskite are unsuitable for a light emitting layer. Thus, in this case, it is not very suitable for the light-emitter having the high color purity, which is highlighted in this patent. Therefore, in order to produce the light-emitter having the high color purity, it is important that the luminescence occurs in an inorganic lattice composed of the central metal-halogen elements without the organic ammonium which does not contain the chromophore. That is, this patent focuses on the development of the light-emitter having high color purity and high efficiency in the inorganic lattice. For example, Korean Published Patent No. 10-2001-0015084 (2001 Feb. 26) discloses an electroluminescent device using a dye-containing organic-inorganic hybrid material as a light-emitting layer by forming their thin film instead of particles. It does not emit light from the perovskite lattice structure.

Until now, metal halide perovskite light emitting devices have been mainly manufactured through a solution process. The solution process does not require expensive deposition equipment and has the advantages of easy manufacturing of large-area devices, but there are disadvantages that the uniformity of the formed thin film is low, thickness control is not easy, and the materials that can be mixed are limited by the properties of the solvent.

In the metal halide perovskite light emitting device, the biggest performance inhibitor is the non-uniform thin film. In a thin film device composed of a stacked thin film, the non-uniformity of the thin film is one of the factors that greatly degrade device performance by breaking the charge balance and generating a leakage current. In particular, since the morphology of the metal halide perovskite thin film varies greatly depending on the conditions for forming the thin film and the surrounding environment, the uniformity of the thin film is very important for the performance of the perovskite light emitting device. An example of a non-uniform thin film is a general spin coating process that forms $CH_3NH_3PbBr_3$. If an additional nanocrystal pinning process is not used, a thin film is formed in the form of an isolated crystal due to spontaneous crystallization [Science 2015, 350, 1222].

The aforementioned nanocrystal pinning process is a process designed to improve the uniformity of the metal halide perovskite thin film and reduce the crystal size [Science 2015, 350, 1222]. The nanocrystal pinning process greatly improves the uniformity of the thin film by dripping the solvent during the spin coating process. In addition, the nanocrystal pinning process has an advantage in that the size and packing density of the perovskite crystals can be controlled because crystallization that occurs gradually during the spin coating process is forcibly ceased by the dripping solvent.

However, in the case of using the nanocrystal pinning process, since the film quality of the thin film can be greatly influenced by the experimental environment, there is a disadvantage that the film quality deviation is large even although the same process is used. In addition, since the film quality of the thin film is improved only in a small region where nanocrystal pinning process is applied, there may be limitations in demonstrating a large-area device. In addition, the thin film formed through such a solution process has a problem in that it is impossible to precisely control the thickness.

Accordingly, there is a need for a manufacturing method capable of finely controlling the thickness and increasing luminous efficiency when manufacturing the perovskite light emitting layer.

DISCLOSURE

Technical Problem

A first object of the present invention is to provide a light emitting device including a light emitting layer having a stacked structure of two or more layers in which light emitting material layers having different band gaps are alternately disposed.

A second object of the present invention is to provide a method of manufacturing a light emitting device including a light emitting layer having a stacked structure of two or more layers in which light emitting material layers having different band gaps are alternately disposed.

Technical Solution

To achieve the objectives, one aspect of the present invention provides an anode, a cathode, and a light emitting layer formed between the anode and the cathode, wherein the light emitting layer has a first light emitting material layer and a second light emitting material layer alternately disposed to form a stacked structure of two or more layers, and wherein the light-emitting material layer is composed of a perovskite layer and an organic material layer which have different band gaps.

Advantageous Effects

According to the present invention, the energy levels, charge transport, and emission wavelengths in light emitting layer in the light emitting device can be adjusted by using evaporation method. The light emitting material layers having different band gaps are alternately disposed to form light emitting layers having a stacked structure, whereby electrons and holes that flow from the first emission material layer having a larger band gap to the second emission material layer having a smaller band gap can be confined in the second emission material layer by the quantum well confinement effect. Therefore, there is an advantage in that electroluminescence efficiency can be improved by controlling the electron-hole recombination zone of the light emitting device. In addition, since the light emitting layer has a stacked structure of two or more light emitting material layers having different band gaps, there is an advantage in that a white light emitting device can be realized by adjusting the band gap of each light emitting material layer.

MODES OF THE INVENTION

Figure 1:
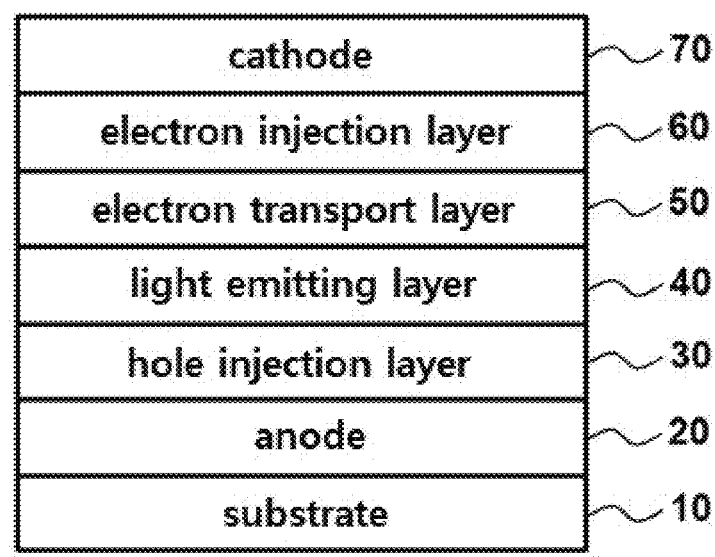
FIG. 1 is a schematic diagram showing a light-emitting device with normal structure according to an embodiment of the present invention.

Hereinafter, preferred embodiments according to the present invention will be described in more detail with reference to the accompanying drawings in order to describe the present invention in more detail.

While the invention is susceptible to various modifications and variations, specific embodiments thereof are illustrated in the drawings, and will be described in detail hereinafter. However, it is not intended to limit the invention to the particular form disclosed, but rather the invention includes all modifications, equivalents and substitutions consistent with the spirit of the invention as defined by the claims.

It will be understood that when an element, such as a layer, region, or substrate, is referred to as being "on" another component, it may be directly on the other element or intervening elements in between.

Although the terms first, second, etc. may be used to describe various elements, components, regions, layers and/or regions, such elements, components, regions, layers and/or regions are not be limited by these terms. In the present specification, the term "light emitting device" may include any device that emits light, such as a light emitting diode, a light emitting transistor, a laser, and a polarized light emitting device.

In the present specification, "perovskite" is described as a metal halide perovskite, but the organic-inorganic hybrid perovskite can also be applied in the same way as the description of the metal halide perovskite.

In the present specification, as generally understood by those skilled in the art, the energy level means "lower" as it is located in the negative (−) direction from the vacuum level (0 eV). That is, the LUMO (Lowest Unoccupied Molecular Orbital) energy level of a material is closer to the vacuum level than the HOMO (Highest Occupied Molecular Orbital) energy of the same material, so it has a "higher" energy level. In addition, the difference between the energy level of Valence Band Maximum (VBM) and the energy level of Conduction Band Minimum (CBM) is called a band-gap.

The present invention provides a light emitting device including a perovskite light emitting layer having a stacked structure.

FIG. 1 is a schematic diagram showing a light emitting device (normal structure) according to an embodiment of the present invention.

Referring to FIG. 1, the light emitting device according to the present invention may include an anode 20 and a cathode 70, and a light emitting layer 40 disposed between the two electrodes, and may include hole injection layer 30 between the anode 20 and the light emitting layer 40. An electron transport layer 50 for transporting electrons may be provided between the light emitting layer 40 and the cathode 70. In addition, in order to facilitate the injection of electrons, the electron injection layer 60 may be further provided between the electron transport layer and the cathode, and a hole transport layer (not shown) for transporting holes may be further included between the hole injection layer 30 and the light emitting layer 40. In addition, a hole blocking layer (not shown) may be disposed between the light emitting layer 40 and the electron transport layer 50. In addition, an electron blocking layer (not shown) may be disposed between the light emitting layer 40 and the hole transport layer. However, the present invention is not limited thereto, and the electron transport layer 50 may serve as a hole blocking layer, or the hole transport layer may serve as an electron blocking layer.

The anode 20 may be a conductive metal oxide, metal, metal alloy, or carbon material. Conductive metal oxides may include Indium Tin Oxide (ITO), Fluorine Tin Oxide (FTO), Antimony Tin Oxide (ATO), fluorine doped tin oxide (FTO), $SnO_2$, ZnO or a combination thereof. As the anode 20, it may be a suitable metal. It may be a metal alloy, and may be Au and CuI as an example. Alternatively, it may be a carbon material, and may be graphite, graphene, or carbon nanotubes as an example.

The cathode 70 may be a conductive layer having a lower work function than that of the anode 20. For example, it may be formed using a metal such as aluminum, magnesium, calcium, sodium, potassium, indium, yttrium, lithium, silver, lead, cesium, or a combination of two or more thereof.

The anode 20 and the cathode 70 may be formed using a sputtering method, a vapor deposition method, or an ion beam deposition method. The hole injection layer 30, the hole transport layer, the light emitting layer 40, the hole blocking layer, the electron transport layer 50 and the electron injection layer 60 can be formed using, regardless of each other, a deposition method or a coating method, for example, spraying, spin coating, dipping, printing, doctor blading, or electrophoresis.

The hole injection layer 30 or the hole transport layer (not shown) is a layer having a HOMO energy level which is located between the work function level of the anode 20 and the VBM energy level of the light emitting layer 40, and it functions to increase the injection or transport efficiency of holes from the anode 20 to the light emitting layer 40.

The hole injection layer 30 or the hole transport layer (not shown) may include a material commonly used as a hole transport material, and one layer may include different hole transport material layers.

Hole transport materials may include, for example, mCP (N,Ndicarbazolyl-3,5-benzene), PEDOT:PSS (poly(3,4-ethylenedioxythiophene):polystyrenesulfonate), NPD (N,N'-di (1-naphthyl)-N,N'-diphenylbenzidine), TPD (N,N'-Bis(3-methylphenyl)-N,N'-diphenylbenzidine), DNTPD ($N^4,N^4$-Bis[4-[bis(3-methylphenyl)amino]phenyl]-$N^4,N^{4'}$-diphenyl-[1,1'-biphenyl]-4,4'-diamine), N,N'-diphenyl-N,N'-dinaphthyl-4,4'-diaminobiphenyl, N,N,N'N'-tetra-p-tolyl-4,4'-diaminobiphenyl, N,N,N'N'-tetraphenyl-4,4'-diaminobiphenyl, porphyrin compound derivatives such as copper (II)1,10,15,20-tetraphenyl-21H,23H-porphyrin; TAPC (1,1-Bis[4-[N,N'-Di(p-tolyl)Amino]Phenyl]Cyclohexane), Triarylamine derivatives such as N,N,N-tri(p-tolyl)amine, 4,4', 4'-tris[N-(3-methylphenyl)-N-phenylamino]triphenylamine, Carbazole derivatives such as N-phenylcarbazole and polyvinylcarbazole; phthalocyanine derivatives such as metal-free phthalocyanine and copper phthalocyanine, starburst amine derivatives, enaminestilbene derivatives, derivatives of aromatic tertiary amines and styryl amine compounds, or polysilane. Such a hole transport material may serve as an electron blocking layer.

The hole injection layer 30 may also include a hole injection material. For example, the hole injection layer may include at least one of a metal oxide and a hole injection organic material. When the hole injection layer 30 includes a metal oxide, the metal oxide may include at least one metal oxide selected from $MoO_3$, $WO_3$, $V_2O_5$, nickel oxide (NiO), copper oxide (Copper(II) Oxide: CuO), copper aluminum oxide (Copper Aluminum Oxide: CAO, $CuAlO_2$). Zinc Rhodium Oxide (ZRO), $ZnRh_2O_4$, GaSnO, or GaSnO doped with metal-sulfide (FeS, ZnS or CuS). When the hole injection layer 30 contains a hole injection organic material, the hole injection layer 30 may be formed according to a method arbitrarily selected from a variety of known methods such as a vacuum deposition method, a spin coating method, a cast method, a Langmuir-Blodgett (LB) method, a spray coating method, a dip coating method, a gravure coating method, a reverse offset coating method, a screen printing method, a slot-die coating method and a nozzle printing method. The hole-injecting organic material may include at least one selected from the group consisting of Fullerene ($C_{60}$), HAT-CN, $F_{16}$CuPC, CuPC, m-MTDATA [4,4',4"-tris (3-methylphenylphenylamino)triphenylamine](see formula 1 below), NPB [N,N'-Di(1-naphthyl)-N,N'-diphenyl-(1,1'-biphenyl)-4,4'-diamine)], TDATA (see formula 2 below), 2-TNATA (see formula 3 below), Pani/DBSA (Polyaniline/Dodecylbenzenesulfonic acid), PEDOT/PSS (Poly(3,4-ethylenedioxythiophene)/Poly(4-styrenesulfonate)), Pani/CSA (Polyaniline/Camphor sulfonic acid) and PANI/PSS (Polyaniline)/Poly(4-styrenesulfonate).

[Formula 1]

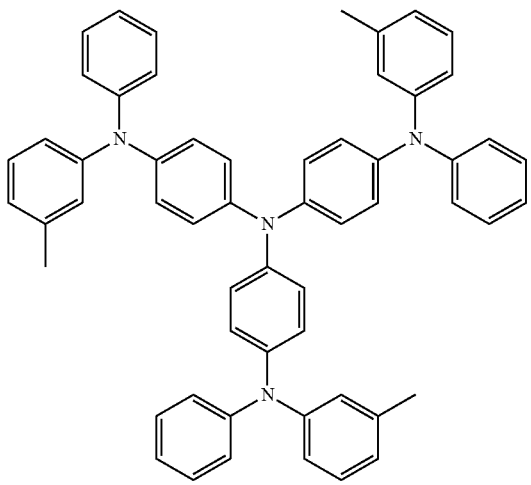

[Formula 2]

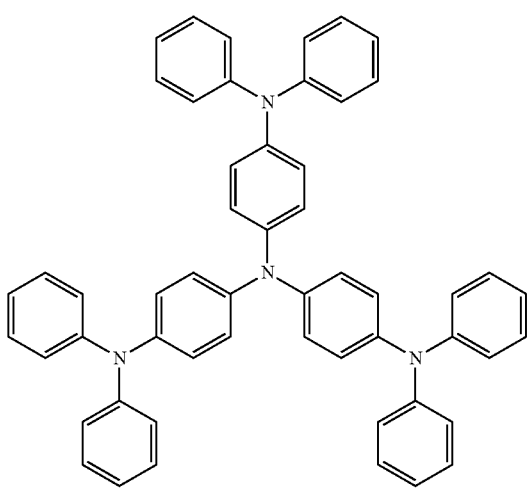

[Formula 3]

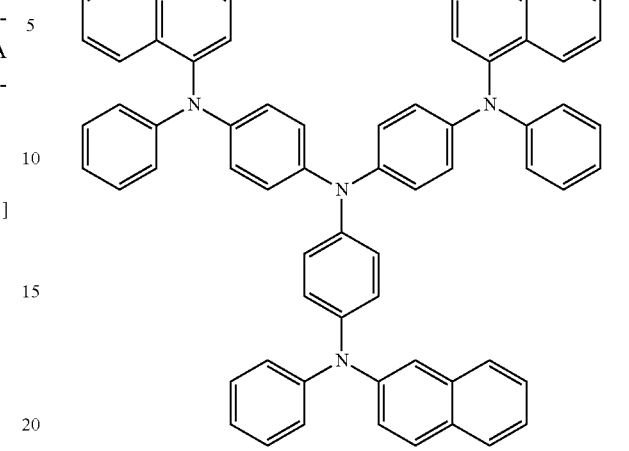

For example, the hole injection layer may be a layer in which the metal oxide is doped into the hole injecting organic material matrix. In this case, the doping concentration is preferably 0.1 wt % to 80 wt % based on the total weight of the hole injection layer.

The hole injection layer may have a thickness of 1 nm to 1000 nm. For example, the thickness of the hole injection layer is 10 nm to 100 nm. When the thickness of the hole injection layer satisfies the above-described range, the driving voltage is not increased, so that a high-quality organic device can be implemented.

In addition, a hole transport layer may be further formed between the light-emitting layer and the hole injection layer. The hole transport layer may include a known hole transport material. For example, the hole transport material may include at least one selected from the group consisting of 1,3-bis(carbazol-9-yl)benzene (mCP), 1,3,5-tris(carbazol-9-yl)benzene (TCP), 4,4',4''-tris(carbazol-9-yl)triphenylamine (TCTA), 4,4'-bis(carbazol-9-yl)biphenyl (CBP), N,N'-bis(naphthalen-1-yl)-N,N'-bis(phenyl)-benzidine (NPB), N,N'-bis(naphthalen-2-yl)-N,N'-bis(phenyl)-benzidine (p-NPB), N,N'-bis(naphthalen-1-yl)-N,N'-bis(phenyl)-2,2'-dimethylbenzidine ((x-NPD), Di-[4-(N,N-ditolyl-amino)-phenyl]cyclohexane (TAPC), N,N,N',N'-tetra-naphthalen-2-yl-benzidine (β-TNB) and N4,N4,N4',N4'-tetra(biphenyl-4-yl)biphenyl-4,4'-diamine (TPD15), poly(9,9-dioctylfluorene-co-bis-N,N'-(4-butylphenyl)-bis-N,N'-phenyl-1,4-phenylenedi amine) (PFB), poly(9,9'-dioctylfluorene-co-N-(4-butylphenyl)diphenylamine) (TFB), poly(9,9'-dioctylfluorene-co-bis-N,N'-(4-butylphenyl)-bis-N,N'-phenylbenzidine) (BFB), or poly(9,9-dioctylfluorene-co-bis-N,N'-(4-methoxyphenyl)-bis-N,N'-phenyl-1 and 4-phenylenediamine) (PFMO), but it is not limited thereto. The formulae of the hole transport materials are summarized in Table 1 below.

TABLE 1
NPB
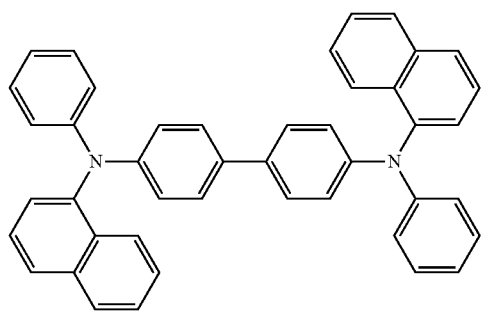 [SMILES: c1ccc(N(c2ccc(-c3ccc(N(c4ccccc4)c4cccc5ccccc45)cc3)cc2)c2cccc3ccccc23)cc1]
CNP
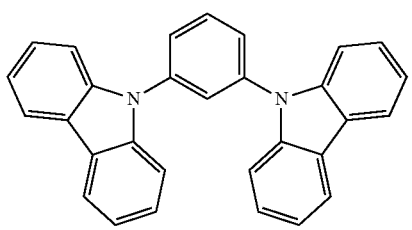 [SMILES: c1cc(-n2c3ccccc3c3ccccc32)cc(-n2c3ccccc3c3ccccc32)c1]
TCP
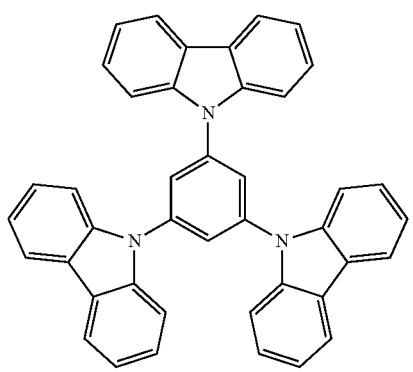 [SMILES: c1ccc2c(c1)c1ccccc1n2-c1cc(-n2c3ccccc3c3ccccc32)cc(-n2c3ccccc3c3ccccc32)c1]
TCTA
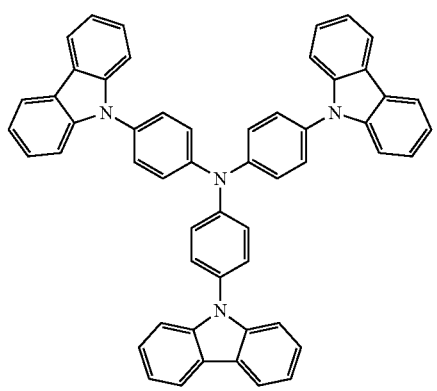 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]
CBP
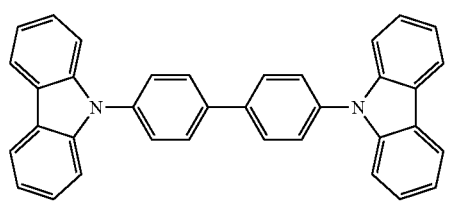 [SMILES: c1ccc2c(c1)c1ccccc1n2-c1ccc(-c2ccc(-n3c4ccccc4c4ccccc43)cc2)cc1]
β-NPB
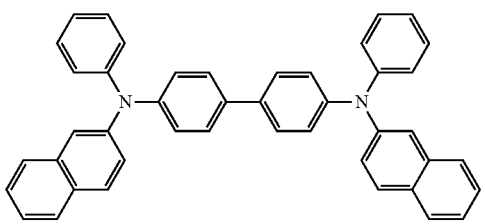 [SMILES: c1ccc(N(c2ccc(-c3ccc(N(c4ccccc4)c4ccc5ccccc5c4)cc3)cc2)c2ccc3ccccc3c2)cc1]
α-NPD
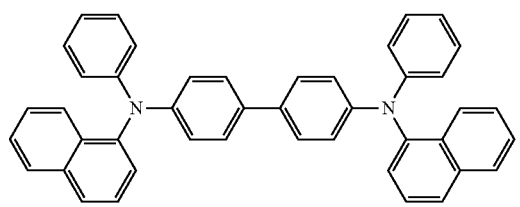 [SMILES: c1ccc(N(c2ccc(-c3ccc(N(c4ccccc4)c4cccc5ccccc45)cc3)cc2)c2cccc3ccccc23)cc1]
TAPC
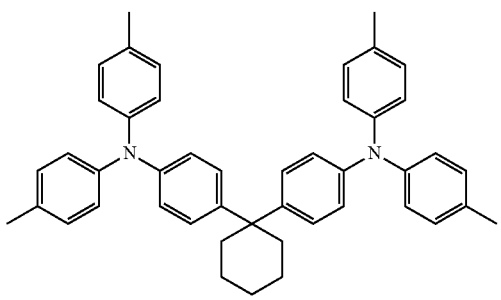

TABLE 1-continued

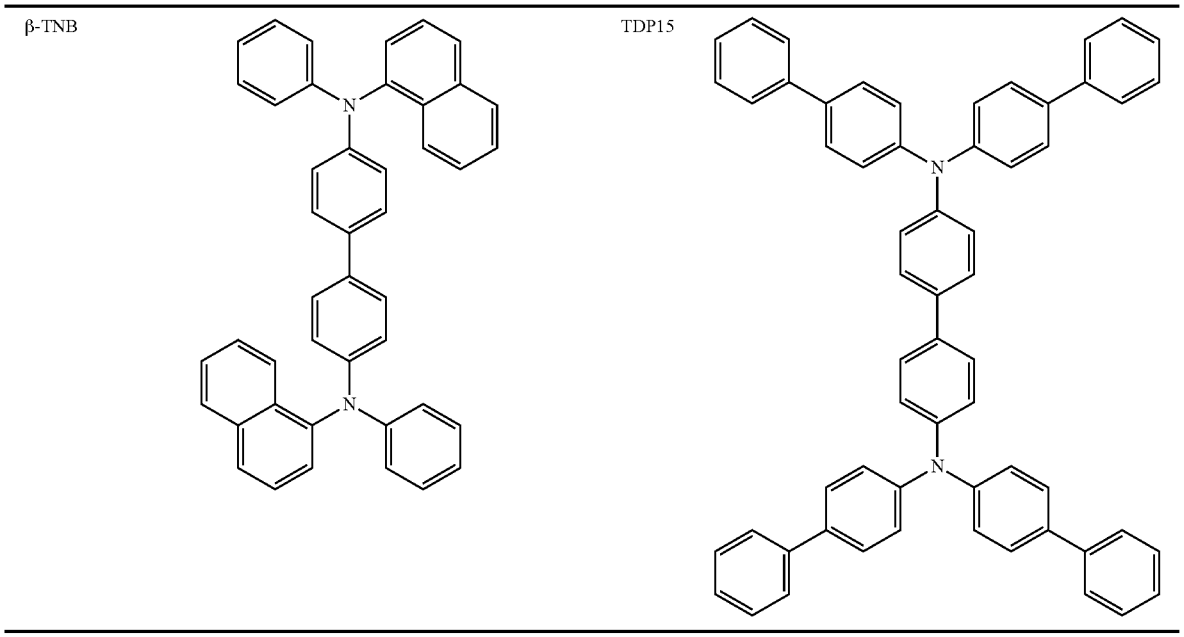

Among the hole transport layers, for example, in the case of TCTA, in addition to the hole transport role, it may play a role of preventing diffusion of excitons from the light emitting layer.

The light emitting layer 40 is formed between the hole injection layer 30 and the electron injection layer 60. Holes flowing in from the anode 20 and electrons flowing from the cathode 70 combine to form excitons, and as the excitons transit to a ground state, light is emitted to cause light emission. A detailed description of the light emitting layer will be described in more detail below.

The electron injection layer 60 and the electron transport layer (not shown) have a LUMO energy level between a work function level of the cathode 70 and CBM energy level of the light emitting layer 40, and function to increase injection or transport efficiency of electrons from the cathode 70 to the light emitting layer 40.

The electron injection layer 60 or the electron transport layer (not shown) may include a material commonly used as an electron transport material, and one layer may include different electron transport material layers.

The electron injection layer 60 may be, for example, LiF, NaCl, CsF, $Li_2O$, BaO, $BaF_2$, or Liq (lithium quinolate). The electron transport layer 50 may include quinoline derivative, especially tris(8-hydroxyquinoline)aluminum ($Alq_3$), Bis(2-methyl-8-quinolinolate)-4-(phenylphenolato)aluminium (Balq), bis(10-hydroxybenzo[h]quinolinato)-beryllium ($Bebq_2$), 2,9-dimethyl-4,7-diphenyl-1,10-phenanthroline (BCP), 4,7-diphenyl-1,10-phenanthroline (Bphen), 2,2',2"-(benzene-1,3,5-triyl)-tris(1-phenyl-1H-benzimidazole (TPBI), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 2-(4-Biphenylyl)-5-phenyl-1,3,4-oxadiazole (PBD), 2,9-bis(naphthalen-2)-yl)-4,7-diphenyl-1,10-phenanthroline (NBphen), Tris(2,4,6-trimethyl-3-(pyridin-3-yl)phenyl)borane (3TPYMB), phenyl-dipyrenylphosphine oxide ($POPy_2$), 3,3',5,5'-tetra[(m-pyridyl)-phen-3-yl]biphenyl (BP4mPy), 1,3,5-tri[(3-pyridyl)-phen-3-yl]benzene (TmPyPB), 1,3-bis[3,5-di(pyridin-3-yl)phenyl]benzene (BmPyPhB), Bis(10-hydroxybenzo[h]quinolinato)beryllium ($Bepq_2$), Diphenylbis(4-(pyridin-3-yl)phenyl)silane (DPPS) and 1,3,5-tri(p-pyrid-3-yl-phenyl)benzene (TpPyPB), 1,3-bis[2-(2,2'-bipyridine-6-yl)-1,3,4-oxadiazo-5-yl]benzene (Bpy-OXD), 6,6'-bis[5-(biphenyl-4-yl)-1,3,4-oxadiazo-2-yl]-2,2'-bipyridyl (BP-OXD-Bpy), TSPO1 (diphenylphosphine oxide-4-(triphenylsilyl)phenyl), TPBi (1,3,5-tris(N-phenylbenzimidazol-2-yl)benzene), tris(8-quinolinorate) aluminum (Alq3), 2,5-diaryl silol derivative (PyPySPyPy), perfluorinated compound (PF-6P), or COTs (Octasubstituted cyclooctatetraene). The formulae of the electron transport materials are summarized in Table 2 below.

TABLE 2

TPBI

BCP

Balq

Alq3

PBD

Bphen

TABLE 2-continued
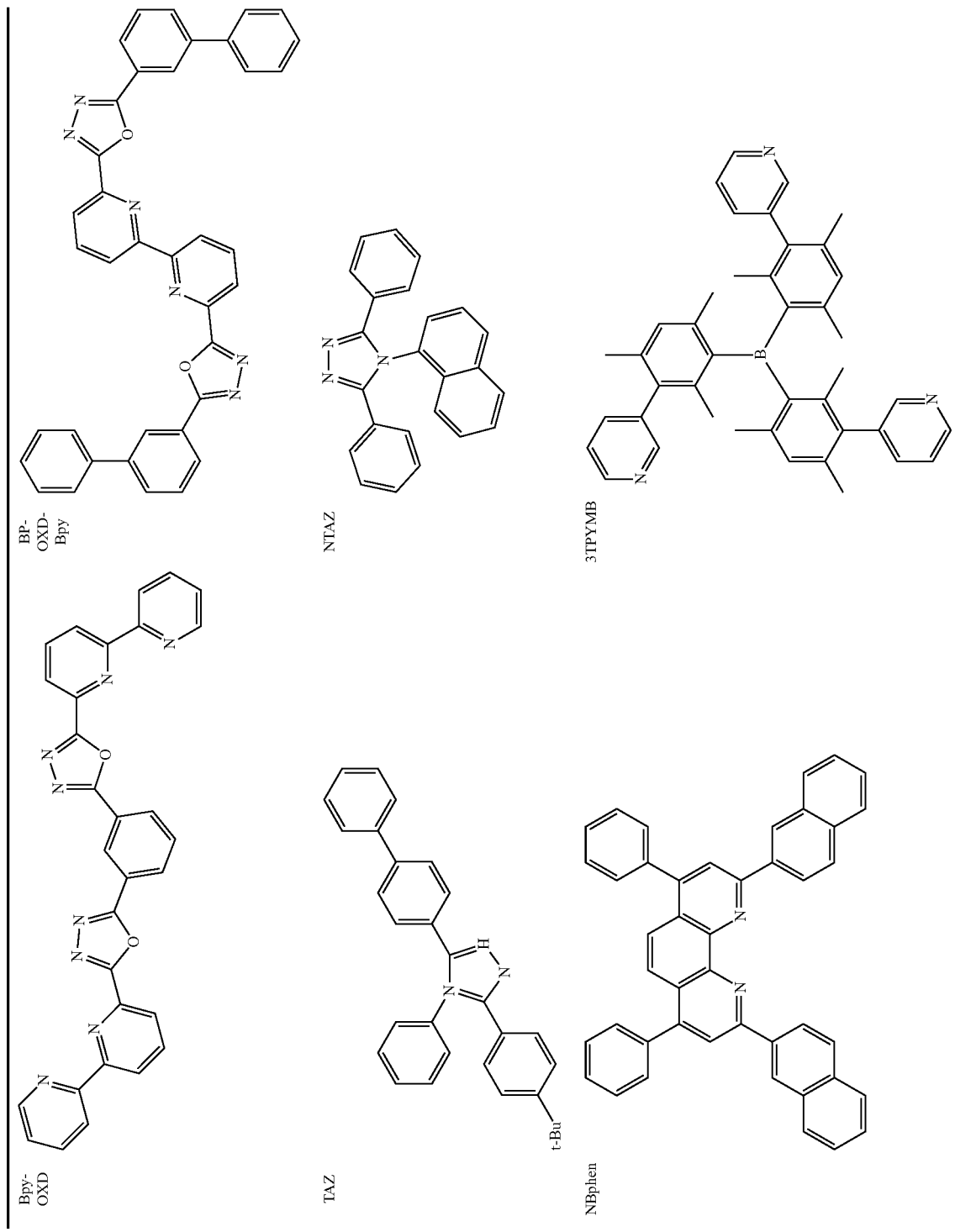

TABLE 2-continued
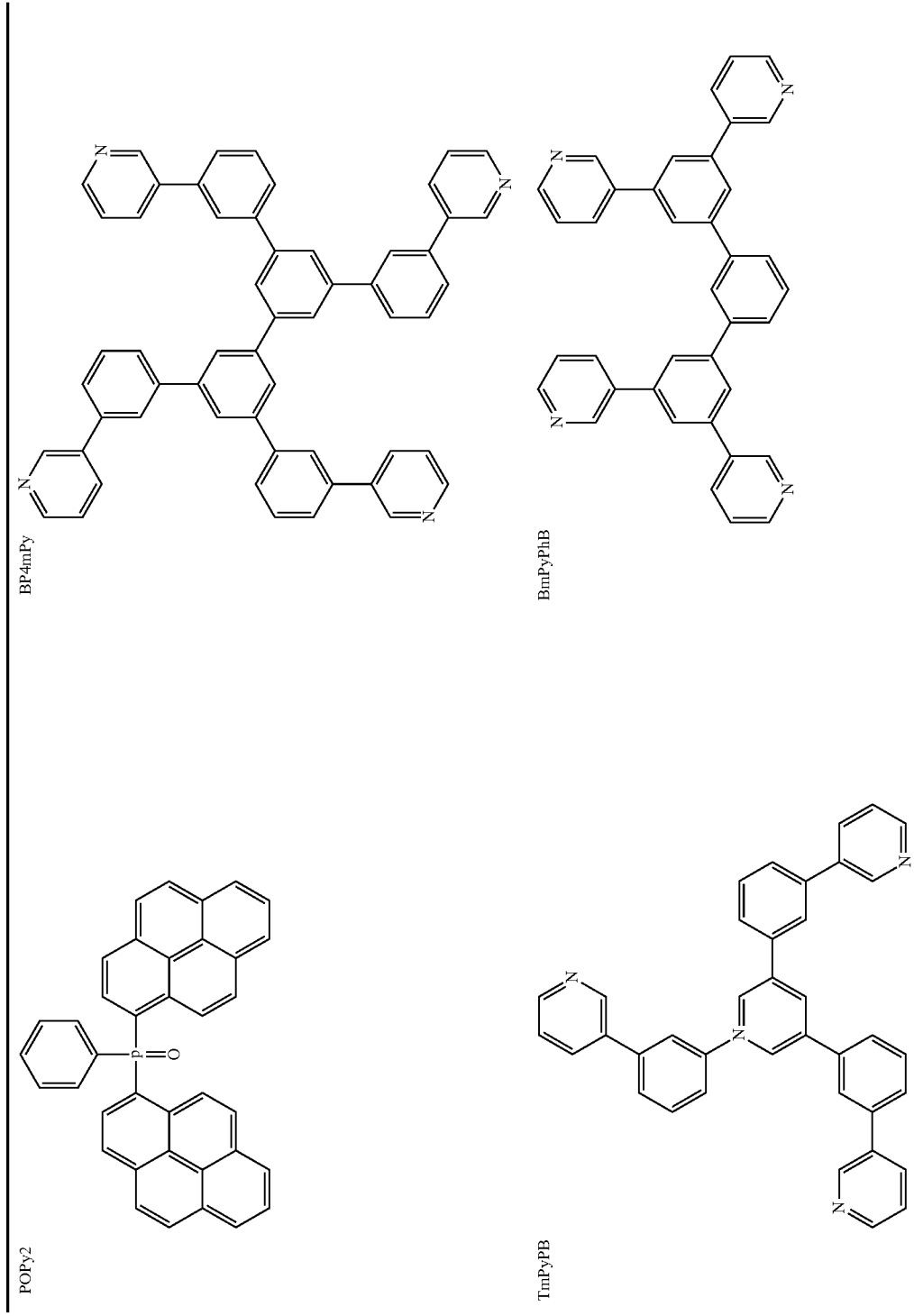

TABLE 2-continued
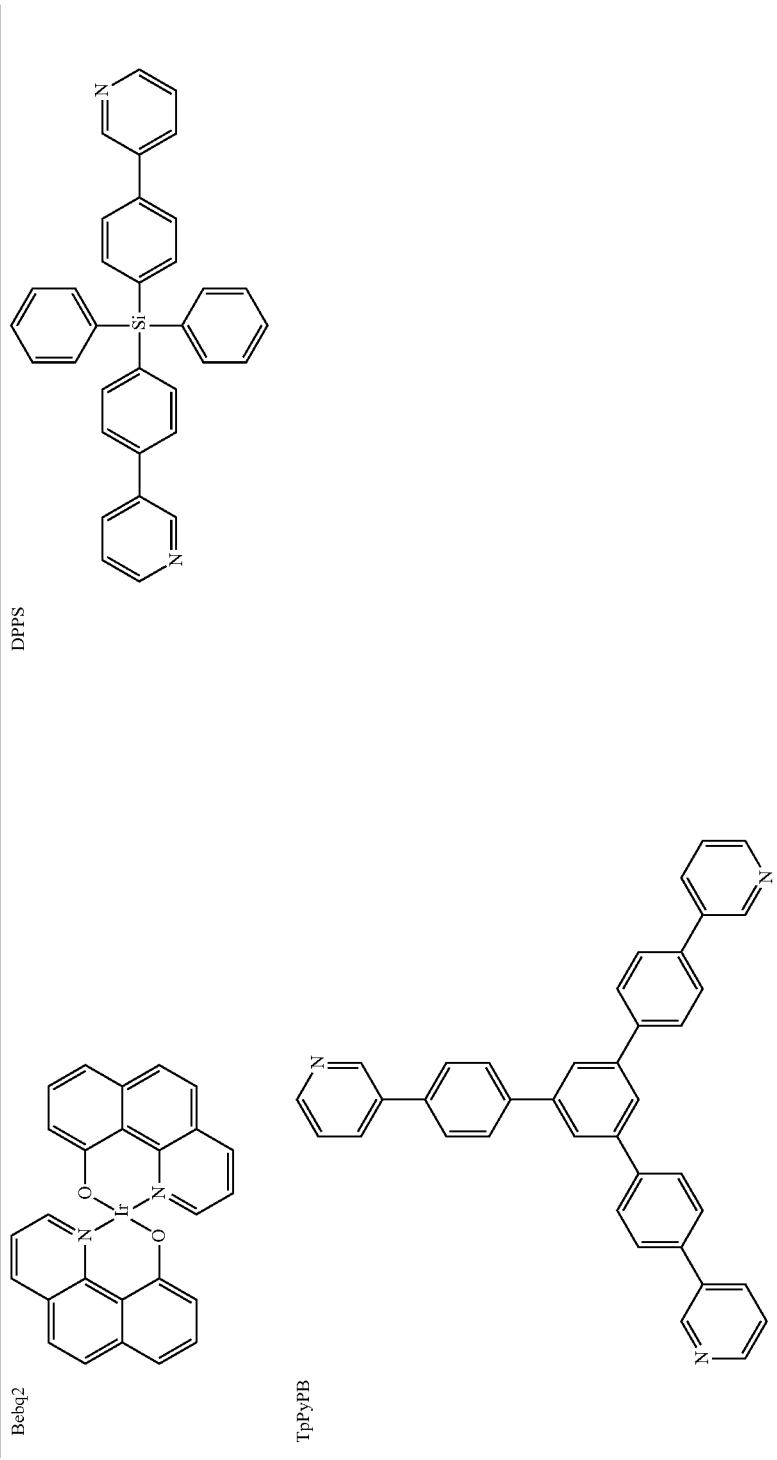
DPPS
Bebq2
TpPyPB

The electron injection layer 60 may include a metal oxide. Since the metal oxide has an n-type semiconductor characteristic, it is excellent in electron transport ability, and further, it can be selected from semiconductor materials having excellent transparency in the visible light region, which are materials that are not reactive to air or moisture. The electron injection layer 60 may include at least one metal oxide selected from among, for example, aluminum doped zinc oxide (AZO), alkali metal (Li, Na, K, Rb, Cs or Fr) doped AZO, $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, vanadium(IV) oxide ($VO_2$), $V_4O_7$, $V_5O_9$, or $V_2O_3$), molybdenum oxide ($MoO_3$ or $MoO_x$), copper oxide (Copper(II) Oxide: CuO), nickel oxide (NiO), copper aluminum oxide (Copper Aluminum Oxide: CAO, $CuAlO_2$), Zinc Rhodium Oxide: ZRO, $ZnRh_2O_4$, iron oxide, chromium oxide, bismuth oxide, IGZO (indium-Gallium Zinc Oxide), and $ZrO_2$, but is not limited thereto. As an example, the electron injection layer 60 may be a metal oxide thin film layer, a metal oxide nanoparticle layer, or a layer including metal oxide nanoparticles in the metal oxide thin film.

The electron injection layer 60 may be formed using a wet process or a vapor deposition method. As an example of a wet process, when the electron injection layer 60 is formed by a solution method (ex. a sol-gel method), mixture solution which includes a solvent and at least one of a sol-gel precursor of a metal oxide and a metal oxide in the form of nanoparticles is applied on the substrate 10 and then heat treatment. In this case, the solvent may be removed by heat treatment or the electron injection layer 60 may be crystallized. The method of providing the mixture solution for the electron injection layer on the substrate 10 may be selected from a known coating method, for example, a spin coating method, a cast method, a Langmuir-Blodgett (LB) method, a spray coating method, a dip coating method, gravure coating method, a reverse offset coating method, a screen printing method, a slot-die coating method, a nozzle printing method, and a dry transfer printing method, but the present invention is not limited thereto.

The sol-gel precursor of the metal oxide may include at least one selected from the group consisting of a metal salt (e.g., metal halide, metal sulfate, metal nitrate, metal perchlorate, metal acetate, metal carbonate, etc.), metal salt hydrate, metal hydroxide, metal alkyl, metal alkoxide, metal carbide, metal acetylacetonate, metal acid, metal acid salt, metal acid salt hydrate, metal sulfide, metal acetate, metal alkanoate, metal phthalocyanine, metal nitride, and metal carbonate.

When the metal oxide is ZnO, the ZnO sol-gel precursor that may be used includes at least one selected from the group consisting of zinc sulfate, zinc fluoride, zinc chloride, zinc bromide, zinc iodide, zinc perchlorate, zinc hydroxide ($Zn(OH)_2$), zinc acetate ($Zn(CH_3COO)_2$), zinc acetate hydrate ($Zn(CH_3(COO)_2 \cdot nH_2O$), diethyl zinc ($Zn(CH_3CH_2)_2$), zinc nitrate ($Zn(NO_3)_2$), zinc nitrate hydrate ($Zn(NO_3)_2 \cdot nH_2O$), zinc carbonate ($Zn(CO_3)$), zinc acetylacetonate ($Zn(CH_3COCHCOCH_3)_2$), and zinc acetylacetonate hydrate ($Zn(CH_3COCHCOCH_3)_2 \cdot nH_2O$), but it is not limited thereto.

When the metal oxide is indium oxide ($In_2O_3$), the $In_2O_3$ sol-gel precursor that may be used includes at least one selected from the group consisting of indium nitrate hydrate ($In(NO_3)_3 \cdot nH_2O$), indium acetate ($In(CH_3COO)_2$), indium acetate hydrate ($In(CH_3(COO)_2 \cdot nH_2O$), indium chloride (InCl, $InCl_2$, $InCl_3$), indium nitrate ($In(NO_3)_3$), indium nitrate hydrate ($In(NO_3)_3 \cdot nH_2O$), indium acetylacetonate ($In(CH_3COCHCOCH_3)_2$), and indium acetylacetonate hydrate ($In(CH_3COCHCOCH_3)_2 \cdot nH_2O$).

When the metal oxide is tin oxide ($SnO_2$), the $SnO_2$ sol-gel precursor that may be used includes at least one selected from the group consisting of tin acetate ($Sn(CH_3COO)_2$), tin acetate hydrate ($Sn(CH_3(COO)_2nH_2O$), tin chloride ($SnCl_2$, $SnCl_4$), tin chloride hydrate ($SnCl_n \cdot nH_2O$), tin acetylacetonate ($Sn(CH_3COCHCOCH_3)_2$) and tin acetylacetonate hydrate ($Sn(CH_3COCHCOCH_3)_2 \cdot nH_2O$).

When the metal oxide is gallium oxide ($Ga_2O_3$), the $Ga_2O_3$ sol-gel precursor that may be used includes at least one selected from the group consisting of gallium nitrate ($Ga(NO_3)_3$), gallium nitrate hydrate ($Ga(NO_3)_3 \cdot nH_2O$), gallium acetylacetonate ($Ga(CH_3COCHCOCH_3)_3$)), gallium acetylacetonate hydrate ($Ga(CH_3COCHCOCH_3)_3 \cdot nH_2O$) and gallium chloride ($Ga_2Cl_4$, $GaCl_3$).

When the metal oxide is tungsten oxide ($WO_3$), the $WO_3$ sol-gel precursor that may be used includes at least one selected from the group consisting of tungsten carbide (WC), tungstic acid powder ($H_2WO_4$), tungsten chloride ($WCl_4$, $WCl_6$), tungsten isopropoxide ($W(OCH(CH_3)_2)_6$), sodium tungstate ($Na_2WO_4$), sodium tungstate hydrate ($Na_2WO_4 \cdot nH_2O$), ammonium tungstate ($(NH_4)_6 H_2W_{12}O_{40}$), ammonium tungstate hydrate ($(NH_4)_6 H_2W_{12}O_{40} \cdot nH_2O$) and tungsten ethoxide ($W(OC_2H_5)_6$).

When the metal oxide is aluminum oxide, the aluminum oxide sol-gel precursor that may be used includes at least one selected from the group consisting of aluminum chloride ($AlCl_3$), aluminum nitrate ($Al(NO_3)_3$), aluminum nitrate hydrate ($Al(NO_3)_3 \cdot nH_2O$), and aluminum butoxide ($Al(C_2H_5CH(CH_3)O)$).

When the metal oxide is titanium oxide, the titanium oxide sol-gel precursor that may be used includes at least one selected from the group consisting of titanium isopropoxide ($Ti(OCH(CH_3)_2)_4$), titanium chloride ($TiCl_4$), titanium ethoxide ($Ti(OC_2H_5)_4$)), and titanium butoxide ($Ti(OC_4H_9)_4$).

When the metal oxide is vanadium oxide, the sol-gel precursor of vanadium oxide that may be used includes at least one selected from the group consisting of vanadium isopropoxide ($VO(OC_3H_7)_3$), ammonium vanadate ($NH_4VO_3$), vanadium acetylacetonate ($V(CH_3COCHCOCH_3)_3$), and vanadium acetylacetonate hydrate ($V(CH_3COCHCOCH_3)_3 \cdot nH_2O$).

When the metal oxide is molybdenum oxide, the molybdenum oxide sol-gel precursor that may be used includes at least one selected from the group consisting of molybdenum isopropoxide ($Mo(OC_3H_7)_5$), molybdenum chloride isopropoxide ($MoCl_3(OC_3H_7)_2$)), ammonium molybdnate ($(NH_4)_2MoO_4$), and ammonium molybdenate hydrate ($(NH_4)_2MoO_4 \cdot nH_2O$).

When the metal oxide is copper oxide, the copper oxide sol-gel precursor that may be used includes at least one selected from the group consisting of copper chloride (CuCl, $CuCl_2$), copper chloride hydrate ($CuCl_2 \cdot nH_2O$), copper acetate ($Cu(CO_2CH_3)$, $Cu(CO_2CH_3)_2$), copper acetate hydrate ($Cu(CO_2CH_3)_2 \cdot nH_2O$), copper acetylacetonate ($Cu(C_5H_7O_2)_2$), copper nitrate ($Cu(NO_3)_2$), copper nitrate hydrate ($Cu(NO_3)_2 \cdot nH_2O$), copper bromide (CuBr, $CuBr_2$), copper carbonate ($CuCO_3 \cdot Cu(OH)_2$), copper sulfide ($Cu_2S$, CuS), copper phthalocyanine ($C_{32}H_{16}N_8Cu$), copper trifluoroacetate ($Cu(CO_2CF_3)_2$), copper isobutyrate ($C_8H_{14}CuO_4$), copper ethylacetoacetate ($C_{12}H_{18}CuO_6$), copper 2-ethylhexanoate ($[CH_3(CH_2)_3CH(C_2H_5)CO_2]_2Cu$), copper fluoride ($CuF_2$), copper formate hydrate ($(HCO_2)_2Cu \cdot H_2O$), copper gluconate ($C_{12}H_{22}CuO_{14}$), copper hexa fluoroacetylacetonate (Cu(C$_5$HF$_6$O$_2$)$_2$), copper hexafluoroacetylacetonate hydrate (Cu(C$_5$HF$_6$O$_2$)$_2$·nH$_2$O), copper methoxide (Cu(OCH$_3$)$_2$), copper neodecanoate (C$_{10}$H$_{19}$O$_2$Cu), copper perchlorate hydrate (Cu(ClO$_4$)$_2$·6H$_2$O), copper sulfate (CuSO$_4$), copper sulfate hydrate (CuSO$_4$·nH$_2$O), copper tartrate hydrate ([—CH(OH)CO$_2$]$_2$Cu·nH$_2$O), copper trifluoroacetylacetonate (Cu(C$_5$H$_4$F$_3$O$_2$)$_2$), copper trifluoromethanesulfonate ((CF$_3$SO$_3$)$_2$Cu), and tetraamine copper sulfate hydrate (Cu(NH$_3$)$_4$SO$_4$·H$_2$O).

When the metal oxide is nickel oxide, the sol-gel precursor of nickel oxide that may be used includes at least one selected from the group consisting of nickel chloride (NiCl$_2$), nickel chloride hydrate (NiCl$_2$·nH$_2$O), nickel acetate hydrate (Ni(OCOCH$_3$)$_2$·4H$_2$O), nickel nitrate hydrate (Ni(NO$_3$)$_2$·6H$_2$O), nickel acetylacetonate (Ni(C$_5$H$_7$O$_2$)$_2$), nickel hydroxide (Ni(OH)$_2$), nickel phthalocyanine (C$_{32}$H$_{16}$N$_8$Ni), and nickel carbonate hydrate (NiCO$_3$2Ni(OH)$_2$·nH$_2$O).

When the metal oxide is iron oxide, the sol-gel precursor of iron oxide that may be used includes at least one selected from the group consisting of iron acetate (Fe(CO$_2$CH$_3$)$_2$), iron chloride (FeCl$_2$, FeCl$_3$), iron chloride hydrate (FeCl$_3$·nH$_2$O), iron acetylacetonate (Fe(C$_5$H$_7$O$_2$)$_3$), iron nitrate hydrate (Fe(NO$_3$)$_3$·9H$_2$O), iron phthalocyanine (C$_{32}$H$_{16}$FeN$_8$) and iron oxalate hydrate (Fe(C$_2$O$_4$)·nH$_2$O and Fe$_2$(C$_2$O$_4$)$_3$·6H$_2$O).

When the metal oxide is chromium oxide, the chromium oxide sol-gel precursor that may be used includes at least one selected from the group consisting of chromium chloride (CrCl$_2$, CrCl$_3$), chromium chloride hydrate (CrCl$_3$·nH$_2$O), chromium carbide (Cr$_3$C$_2$), chromium acetylacetonate (Cr(C$_5$H$_7$O$_2$)$_3$), chromium nitrate hydrate (Cr(NO$_3$)$_3$·nH$_2$O), chromium hydroxide acetic acid (CH$_3$CO$_2$)$_7$Cr$_3$(OH)$_2$ and chromium acetate hydrate ([(CH$_3$CO$_2$)$_2$Cr·H$_2$O]$_2$).

When the metal oxide is bismuth oxide, the bismuth oxide sol-gel precursor that may be used includes at least one selected from the group consisting of bismuth chloride (BiCl$_3$), bismuth nitrate hydrate (Bi(NO$_3$)$_3$·nH$_2$O), bismuth acetic acid ((CH$_3$CO$_2$)$_3$Bi), and bismuth carbonate ((BiO)$_2$CO$_3$).

When the metal oxide nanoparticles are contained in the mixed solution for the electron injection layer, the average particle diameter of the metal oxide nanoparticles may be 10 nm to 100 nm.

The solvent may be a polar solvent or a non-polar solvent. For example, examples of the polar solvent include alcohols or ketones, and examples of the nonpolar solvent include aromatic hydrocarbons, alicyclic hydrocarbons, or aliphatic hydrocarbon-based organic solvents. As an example, the solvent may include at least one selected from the group consisting of ethanol, dimethylformamide, ethanol, methanol, propanol, butanol, isopropanol, methyl ethyl ketone, propylene glycol (mono) methyl ether (PGM), isopropyl cellulose (IPC), ethylene carbonate (EC), methyl cellosolve (MC), ethyl cellosolve, 2-methoxy ethanol and ethanolamine. But it is not limited thereto.

For example, when forming the electron injection layer 60 made of ZnO, the mixture for the electron injection layer may include zinc acetate dehydrate as a precursor of ZnO, and may include combination of 2-methoxy ethanol and ethanolamine as solvents, but it is not limited thereto.

The heat treatment conditions will vary depending on the type and content of the selected solvent, but it is generally preferably performed within the range of 100° C. to 350° C. and 0.1 hour to 1 hour. When the heat treatment temperature and time satisfy this range, the solvent removal effect is good and the device may not be deformed.

When the electron injection layer 60 is formed using a vapor deposition method, it can be deposited by a variety of known methods such as electron beam deposition, thermal evaporation, sputter deposition, atomic layer deposition and chemical vapor deposition. The deposition conditions vary depending on the target compound, the structure of the target layer, and thermal properties, but for example, the deposition temperature range of 25 to 1500° C., specifically 100 to 500° C., and the vacuum degree range of $10^{-10}$ to $10^{-3}$ torr is preferred, and the deposition rate is performed within the range of 0.01 to 100 Å/sec.

The electron injection layer 60 may have a thickness of 10 nm to 100 nm, specifically, 20 nm to 50 nm. Furthermore, the thickness of the electron transport layer is 5 nm to 100 nm. For example, the thickness of the electron transport layer can be 15 nm to 60 nm. When the thickness satisfies the above-mentioned range, the light efficiency of the organic light emitting diode is improved, the luminance is increased, and excellent electron transport characteristics can be obtained without increasing the driving voltage.

The hole injection layer 30, the hole transport layer (not shown), the electron injection layer 60, or the electron transport layer 50 may include materials used in conventional organic light-emitting diodes. The hole injection layer 30, the hole transport layer, the electron injection layer 60 or the electron transport layer 50 may be formed by performing a method arbitrarily selected from a variety of known methods such as a vacuum deposition method, a spin coating method, a spray method, a dip coating method, a bar coating method, a nozzle printing method, a slot-die coating method, a gravure printing method, a cast method, or a Langmuir-Blodgett (LB) method. During these processes, the conditions and coating conditions for forming the thin film may vary depending on the target compound, the structure and thermal properties of the target layer.

The substrate 10 serves as a support for the light-emitting device and may be a transparent material. In addition, the substrate 10 may be a flexible material or a hard material, and preferably may be a flexible material. The material of the substrate 10 may be glass, sapphire, quartz, silicon, polyethylene terephthalate (PET), polystyrene (PS), polyimide (PI), polyvinyl chloride (PVC), polyvinylpyrrolidone (PVP) or polyethylene (PE), but it is not limited thereto.

Figure 2:
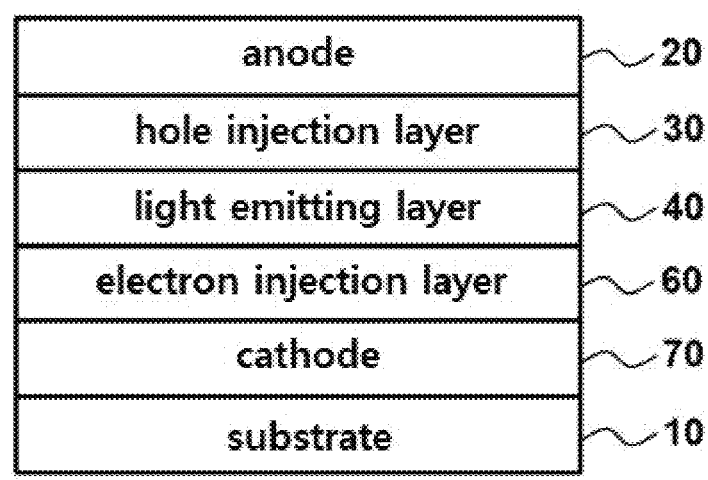
FIG. 2 is a schematic diagram showing a light-emitting device with inverted structure according to another embodiment of the present invention.

FIG. 2 is a schematic diagram showing a light emitting device (inverted structure) according to another embodiment of the present invention.

As shown in FIG. 2, the cathode 70 is disposed on the substrate 10, the cathode 70 is formed before the anode 20, and it is also possible to constitute a light emitting device having an inverted structure.

According to the present invention, in the light emitting device, the light emitting layer 40 may have a stacked structure of two or more layers in which the first light emitting material layer and the second light emitting material layer are alternately disposed. In this case, the light-emitting material layer may be a perovskite layer or an organic material layer, the perovskite layer may be a light-emitting material layer made of perovskite, and the organic material layer may be a light-emitting material layer made of an organic light-emitting material. Also, the first light-emitting material layer and the second light-emitting material layer may have different band gaps. In this case, each light emitting material layer may be formed by co-deposition. As an example, two perovskite layers having different band gaps may be alternately disposed by co-deposition, and organic material layers and perovskite layers having different band gaps may be alternately disposed by co-deposition.

Until now, metal halide perovskite light emitting layer used in perovskite light emitting devices have been mainly manufactured through a solution process. However, the solution process has disadvantages in that the uniformity of the formed thin film is low, thickness control is not easy, and materials that can be mixed are limited by the properties of the solvent.

In the metal halide perovskite light emitting device, the biggest performance inhibitor is the non-uniform thin film. In a thin film device composed of a stacked thin film, the non-uniformity of the thin film is one of the factors that greatly degrade device performance by breaking the charge balance and generating a leakage current. In particular, since the morphology of the metal halide perovskite thin film varies greatly depending on the conditions for forming the thin film and the surrounding environment, the uniformity of the thin film is very important for the performance of the perovskite light emitting device. An example of a non-uniform thin film is a general spin coating process that forms $CH_3NH_3PbBr_3$. If an additional nanocrystal pinning process is not used, there is a problem in that a thin film is formed in the form of an isolated crystal due to spontaneous crystallization [Science 2015, 350, 1222].

However, in the case of using the nanocrystal pinning process, since the film quality of the thin film can be greatly influenced by the experimental environment, there is a disadvantage that the film quality deviation is large even although the same process is used. In addition, since the film quality of the thin film is improved only in a small region where nanocrystals are pinned, there may be limitations in demonstrating a large-area device However, there has not yet been an example in which the perovskite light emitting layer was manufactured by a deposition process.

The location of the electron-hole recombination zone in the device, that is the emission spectrum of the device, may be affected by the thickness of the light emitting layer and may vary depending on the energy level of the material used. Accordingly, in the present invention, a thin film can be manufactured by co-depositing the first light emitting material layer and the second light emitting material layer through an evaporation method. By co-depositing the first light-emitting material layer and the second light-emitting material layer, a uniform thin film can be formed, the thickness of the thin film can be easily controlled, and the size of the formed perovskite crystal is reduced, so that exciton or a charge carrier may be spatially confined to improve luminescence efficiency.

Figure 3:
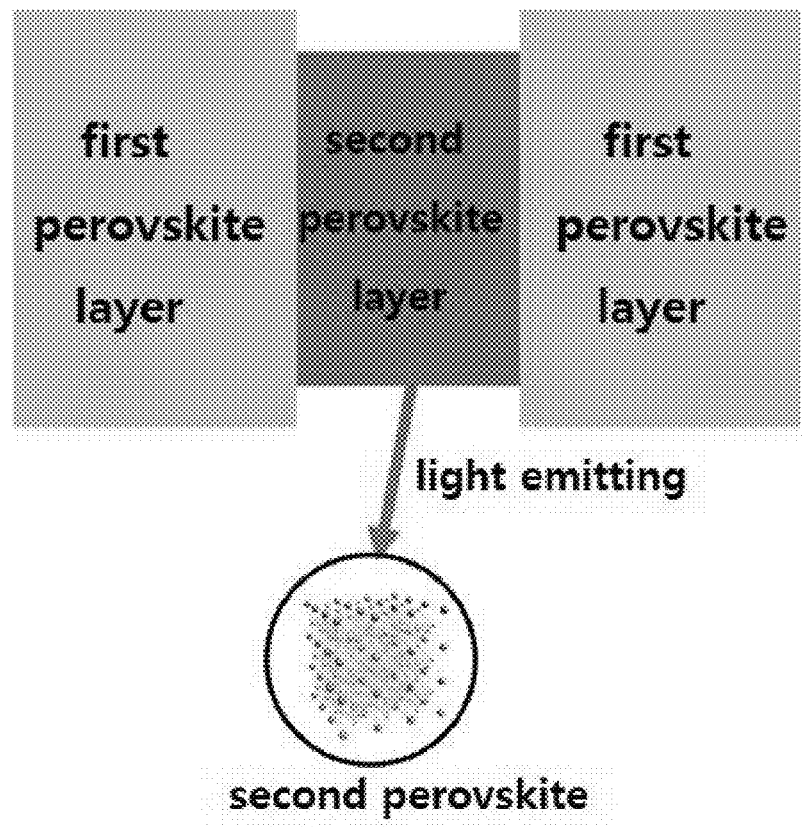
FIG. 3 is a schematic diagram showing a stacked light emitting material layers according to an embodiment of the present invention.
Figure 4:
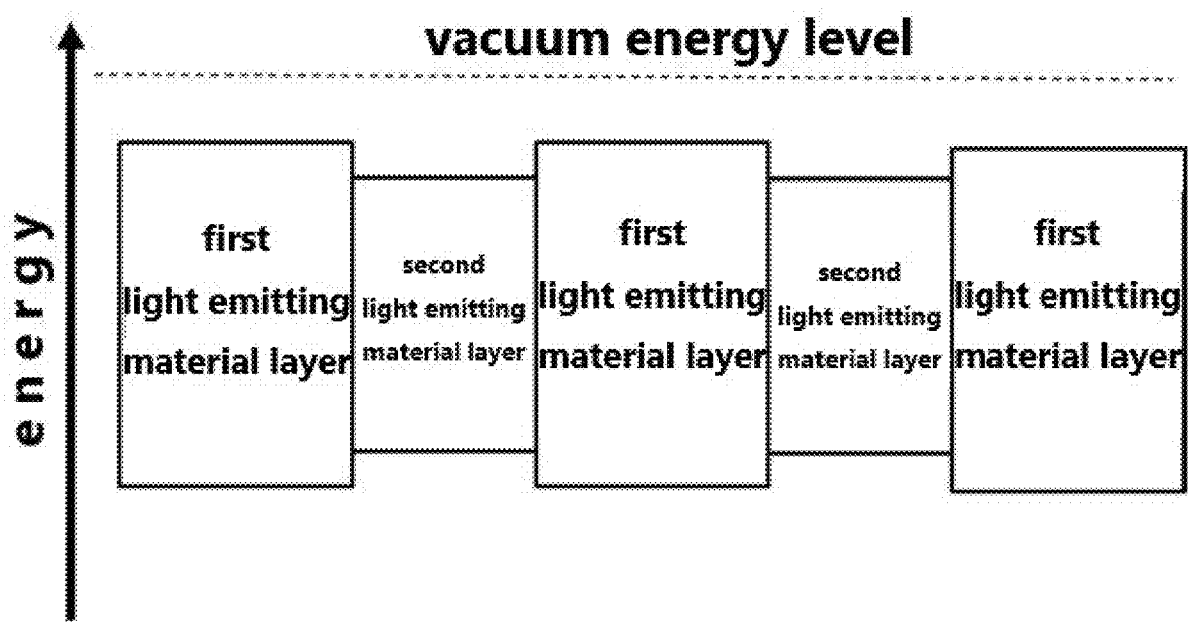
FIG. 4 shows energy level of a light emitting layer having a stacked structure in which first light emitting material layers and second light emitting material layers are alternately disposed according to another embodiment of the present invention.

FIG. 3 is a schematic diagram showing a light emitting layer of a stacked structure according to an embodiment of the present invention, and FIG. 4 shows the energy level of the light emitting layer having a stacked structure in which a first light emitting material layer and a second light emitting material layer are alternately disposed according to another embodiment of the present invention.

Referring to FIGS. 3 and 4, the light emitting layer of the stacked structure according to the present invention may have a stacked structure in which first light emitting material layers and second light emitting material layers are alternately disposed. In addition, the first light-emitting material layer and the second light-emitting material layer may include perovskite having different band gaps. More specifically, a band gap of the first light emitting material layer may be larger than a band gap of the second light emitting material layer.

Specifically, the energy level of the valence band maximum (VBM) of the first light emitting material layer may be lower than the energy level of VBM of the second light emitting material layer. That is, the VBM of the first light-emitting material layer may be located in a more negative (−) direction from the vacuum level than the VBM of the second light-emitting material layer. In addition, the energy level of the conduction band minimum (CBM) of the first light emitting material layer may be higher than the CBM of the second light emitting material layer. That is, the CBM of the first light-emitting material layer may be closer to the vacuum level than the CBM of the second light-emitting material layer.

The energy level of the valence band maximum (VBM) of the light emitting layer may be lower than the work function of the anode and the HOMO energy level of the hole injection layer. In addition, the energy level of the conduction band minimum (CBM) of the light emitting layer may be higher than the work function of the cathode or the LUMO energy level of the electron transport layer.

As such, in the case of a light emitting layer in which perovskite having different band gaps is alternately disposed and stacked, an energy transfer behavior may vary according to an energy level of a material, and the energy transfer occurs from the first light emitting material layer having a larger band gap to a second light emitting material layer having a smaller band gap in the material layer. That is, only the second light emitting material layer may emit light.

That is, the first light emitting material layer and the second light emitting material layer having different band gaps are alternately disposed to form a light emitting layer having a stacked structure. And electrons and holes that flows from the first light emitting material layer having a greater band gap to the second light emitting material layer having a smaller band gap are confined by a quantum well confinement effect. Therefore, the electron-hole recombination zone of the light emitting device is controlled and the electroluminescent efficiency can be improved.

In the present specification, to measure the energy level of VBM of the light emitting material layer including a perovskite, a UPS (UV photoelectron spectroscopy) can be used as a method of measuring the ionization potential of a material by irradiating UV on the surface of the thin film and then detecting the electrons emitted from the film surface. Alternatively, the measurement of the energy level of VBM is measured by using CV (cyclic voltammetry), which measures the oxidation potential via voltage sweep after dissolving the material to be measured in a solvent together with the electrolytic solution. In addition, a PYSA (Photoemission Yield Spectrometer in Air) method for measuring the ionization potential in the atmosphere can be used using an AC-3 (RKI) equipment.

In addition, the energy level of CBM of the perovskite can be obtained by measuring inverse photoelectron spectroscopy (IPES) or electrochemical reduction potential. IPES is a method of determining the energy level of CBM by irradiating an electron beam onto a thin film and measuring the light emitted at the same time. In addition, in the measurement of the electrochemical reduction potential, a reduction potential may be measured through a voltage sweep after dissolving a material to be measured in a solvent together with an electrolyte. Alternatively, the energy level of CBM can be calculated using the energy level of VBM and the energy level obtained by measuring the UV absorption level of the target material.

Specifically, the VBM energy level of the present specification was measured via an AC-3 (RKI) equipment after vacuum-depositing the target material with a thickness of 50 nm or more on an ITO substrate. For the CBM energy level, after measuring the absorption spectrum (abs.) and the photoluminescence (PL) of the prepared sample, the edge energy of each absorption spectrum (or peak energy of PL) are calculated, and considers the difference as the band gap (Eg). Then, the CBM energy level is calculated by subtracting the band gap difference from the VBM energy level measured by AC-3.

Figure 5:
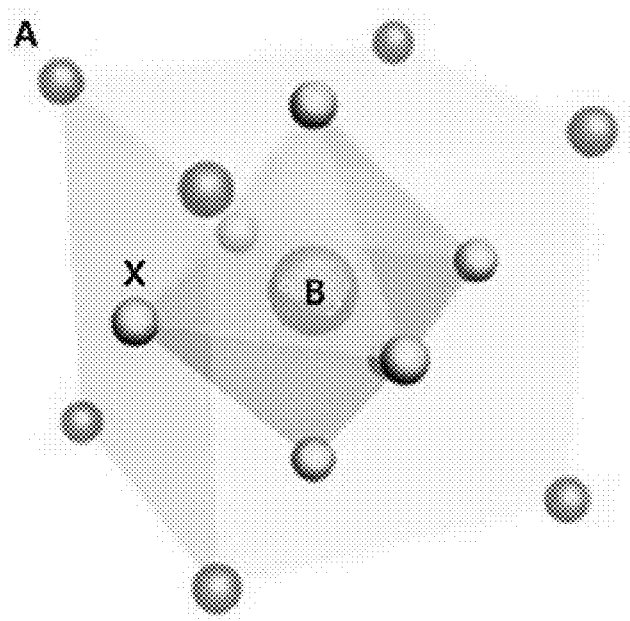
FIG. 5 is a schematic diagram showing a perovskite structure comprised in a light-emitting layer according to an embodiment of the present invention.

FIG. 5 is a schematic view of a perovskite structure comprised in a light-emitting layer according to an embodiment of the present invention.

The light emitting layer according to the present invention includes a perovskite layer, and the perovskite layer may be a light emitting material layer including perovskite.

The perovskite has a structure of $ABX_3$, $A_2BX_4$, $A_3BX_5$, $A_4BX_6$, $ABX_4$ or $A_{n-1}Pb_nX_{3n+1}$ (n is an integer between 2 and 6), where A is an organic ammonium ion, organic amidinium ion, organic phosphonium ion, alkali metal ion or derivatives thereof, the above B contains transition metals, rare earth metals, alkaline earth metals, organic materials, inorganic materials, ammonium, derivatives thereof or combinations thereof, the above X is a halogen ion or a combination of different halogen ions.

More specifically, the perovskite may be a metal halide perovskite, and the crystal structure of the metal halide perovskite has a central metal (B) in the center as shown in FIG. 5. In a face centered cubic (FCC), six halogen elements (X) are located on all surfaces of the cube, and in a body centered cubic (BCC) structure, eight elements A (organic ammonium, organic amidinium, organic phosphonium, or alkali metal) are located at all vertices of the cube. Also, all sides of the hexahedron are orthogonal, and it includes not only a cubic structure with the same horizontal length, vertical length, and height, but also a tetragonal structure having the same horizontal length and vertical length but different heights.

The A may be $(CH_3NH_3)_n$, $((C_xH_{2x+1})_nNH_2)(CH_3NH_3)_n$, $R(NH_2)_2$ (R is alkyl or fluoroalkyl), $(C_nH_{2n+1}NH_3)_2$, $(CF_3NH_3)$, $(CF_3NH_3)_n$, $((C_xF_{2x+1})_nNH_2)(CF_2NH_3)_n$, $((C_xF_{2x+1})_nNH_3)$, $(C_nH_{2n+1}NH_3)$ (x, n is an integer greater than or equal to 1) or derivative thereof, metal, Na, K, Rb, Cs, Fr, or a combination or derivative thereof.

The B may be a Pb, Mn, Cu, Ga, Ge, In, Al, Sb, Bi, Po, Sn, Eu, Yb, Ni, Co, Fe, Cr, Pd, Cd, Ca, Sr, organoammonium, inorganic ammonium, organocation, combinations thereof or derivatives thereof. The X may be Cl⁻, Br⁻, I⁻, or combinations thereof.

The perovskite nanocrystals included in the light emitting layer may be in the form of a sphere, a cylinder, an elliptical column, or a polygonal column. The bandgap energy of the perovskite nanocrystals may be 1 eV to 5 eV. The emission wavelength of the perovskite nanocrystals may be 200 nm to 1300 nm. The size of the perovskite nanocrystals may be 1 nm to 5 μm. If the size of the perovskite nanocrystals exceeds 5 μm, there may be a fundamental problem that excitons do not emit light and are separated into free charges and disappear due to thermal ionization and delocalization of charge carriers.

In the present invention, by controlling the size of the constituent elements constituting the perovskite crystal or the crystal structure of the perovskite, the first light emitting material layer can be adjusted to have a larger band gap than the second light emitting material layer.

As an example, by controlling the size of A in perovskite in the first light-emitting material layer which are greater than or equal to the size of A in perovskite in the second light-emitting material layer, the band gap of the first light-emitting material layer can be adjusted to be a greater than the band gap of the second light-emitting material layer.

In addition, by controlling the size of X in perovskite in the first light-emitting material layer which are smaller than or equal to the size of X in perovskite in the second light-emitting material layer, the band gap of the first light-emitting material layer can be adjusted to be a greater than the band gap of the second light-emitting material layer.

In addition, by controlling the dimensionality of perovskite in the first light-emitting material layer which are lower than or equal to the dimension in the second light-emitting material layer, the band gap of the first light-emitting material layer can be adjusted to be a greater than the band gap of the second light-emitting material layer.

Specifically, the crystal structure of the perovskite may be a three-dimensional (3D), two-dimensional (2D), one-dimensional (1D) or zero-dimensional (0D) crystal structure. As an example, the structure of $ABX_3$ may be a three-dimensional crystal structure, and the structure of $A_2BX_4$ may be a two-dimensional crystal structure. In addition, the structure of $A_3BX_5$ may be a one-dimensional crystal structure, and $A_4BX_6$ may have a zero-dimensional crystal structure. That is, the bandgap energy of the material layer containing the perovskite can be determined based on the crystal structure of the perovskite, and further, the dimensionality of this perovskite crystal structure can be controlled by the proportion of materials that make up a compound during the synthesis.

As described above, in a light emitting device including a light emitting layer having a stacked structure by alternately disposing the first light emitting material layer and the second light emitting material layer, electroluminescence efficiency can be improved by controlling the energy level to control the electron-hole recombination zone of the light emitting device.

Figure 6:
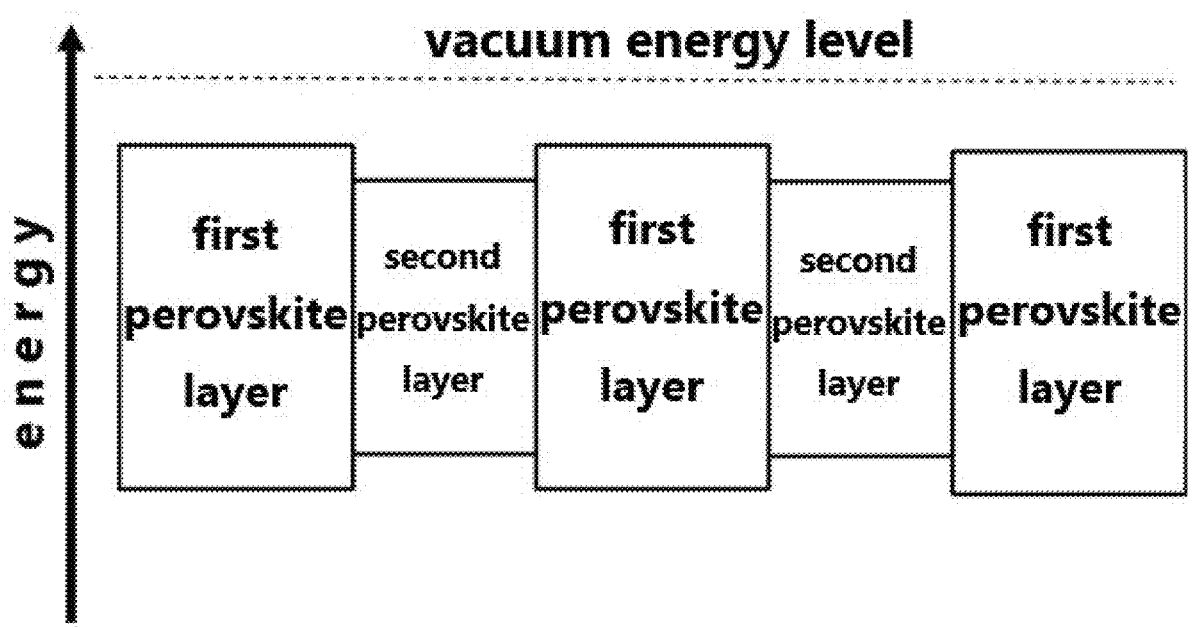
FIG. 6 shows energy level of a light emitting layer having a stacked structure in which first perovskite light emitting material layers and second organic material light emitting layers are alternately disposed according to an embodiment of the present invention.

FIG. 6 shows the energy level of a light-emitting layer having a stacked structure in which a perovskite layer as a first light-emitting material layer and organic material layers as a second light-emitting material layer are alternately stacked, according to an embodiment of the present invention. The first light-emitting material layer, which is the perovskite layer, and the second light-emitting material layer, which is the organic material layer, have different band gaps, so that excitons are confined to the light-emitting material layer with a smaller band gap, resulting in high luminescence efficiency. In addition, it is possible to realize white light emission by controlling the band gap and light emission of the two light emitting material layers.

The light emitting layer according to the present invention includes an organic material layer, and the organic material layer may be a light emitting material layer including an organic light emitter.

The organic light emitting material includes a single light emitting organic material, and may further include a host or a dopant.

The host can be tris(8-quinolinorate) aluminum ($Alq_3$), CBP (4,4'-N,N'-dicarbazole-biphenyl), ADN (9,10-di(naphthalen-2-yl) anthracene), TCTA (4,4',4''-tris(N-carbazolyl) triphenylamine), TPBI (1,3,5-tris(N-phenylbenzimidazol-2-yl), benzene(1,3,5-tris(Nphenylbenzimidazol) e-2-yl) benzene)), TBADN (3-tert-butyl-9,10-di(naphth-2-yl) anthracene), E3, PVK, CBP, dmCBP, BeBq2(Bis(10-hydroxybenzo[h]quinolinato)beryllium) or mixtures thereof, but is not limited thereto. Chemical formulas of the host materials are summarized in Table 3 below.

TABLE 3

| Name | Chemical formula | Name | Chemical formula |
|---|---|---|---|
| Alq3 | | ADN | |
| TCTA | | TAPC | |
| TPBI | | TPBADN | |
| E3 | | PVK | |

TABLE 3-continued
| Name | Chemical formula | Name | Chemical formula |
|---|---|---|---|
| CBP | | dmCBP | |
In the case of the dopant, the blue dopant material is summarized in Table 4 below, but is not limited thereto.
TABLE 4
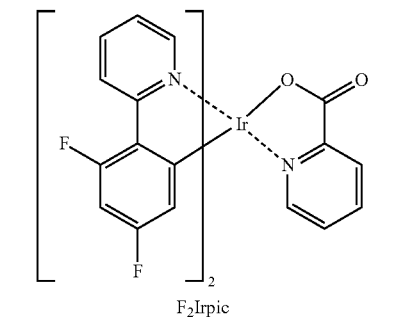
F₂Irpic
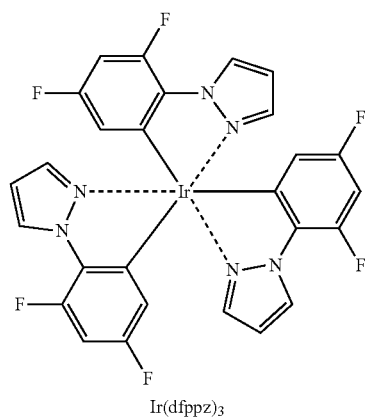
(F₂ppy)₂Ir(tmd)
Ir(dfppz)₃
TABLE 4-continued
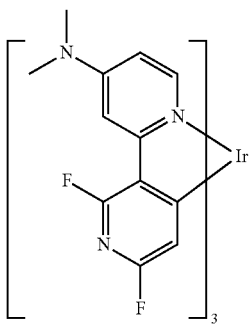
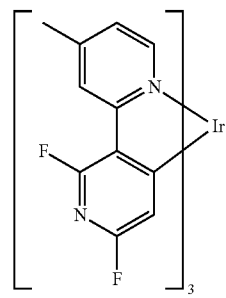
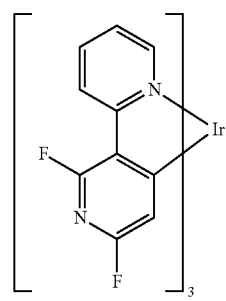
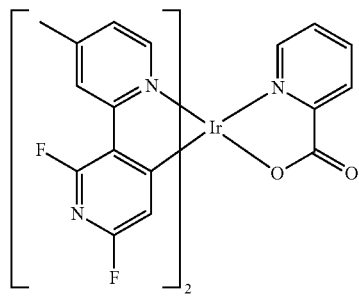

TABLE 4-continued

TABLE 5

PtOEP

Ir(piq)₃

Btp₂Ir(acac)

In the case of the dopant, the red dopant material is summarized in Table 5 below, but is not limited thereto.

TABLE 5-continued

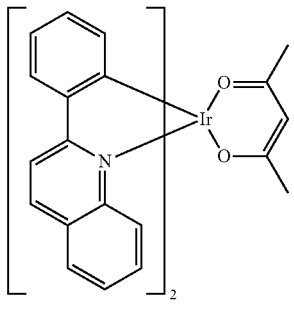

Ir(pq)₂(acac)

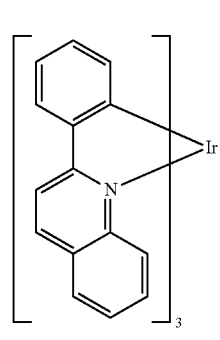

Ir(2-phq)₃

In the case of the dopant, the green dopant material is summarized in Table 6 below, but is not limited thereto.

TABLE 6

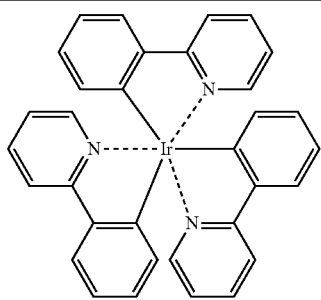

Ir(ppy)₃

TABLE 6-continued

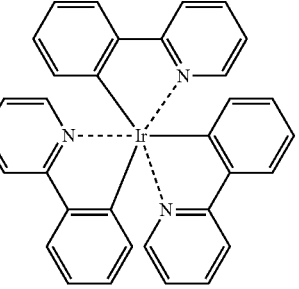

Ir(ppy)₃

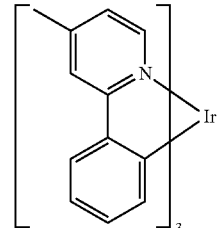

Ir(mpyp)₃

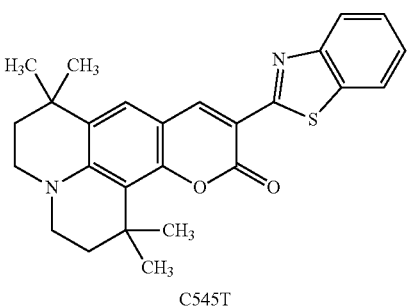

C545T

Meanwhile, the organic light emitting material may be a conjugated polymer, a derivative thereof, or a copolymer thereof. As an example of the conjugated polymer may be polyfluorene, polyspirofluorene, poly(p-phenylene vinylene), poly(p-phenylene), polythiophehne or polycarbazole.

In addition, the organic material layer may include both fluorescence and phosphorescence, and the organic light emitting material may be a polymer in which fluorescent and phosphorescent functional groups are grafted to a non-conjugated polymer. For example, it may include a polymer represented by one of the formulas shown in Chemical Formulas 4 to 22 below, but is not limited thereto.

[Formula 4]
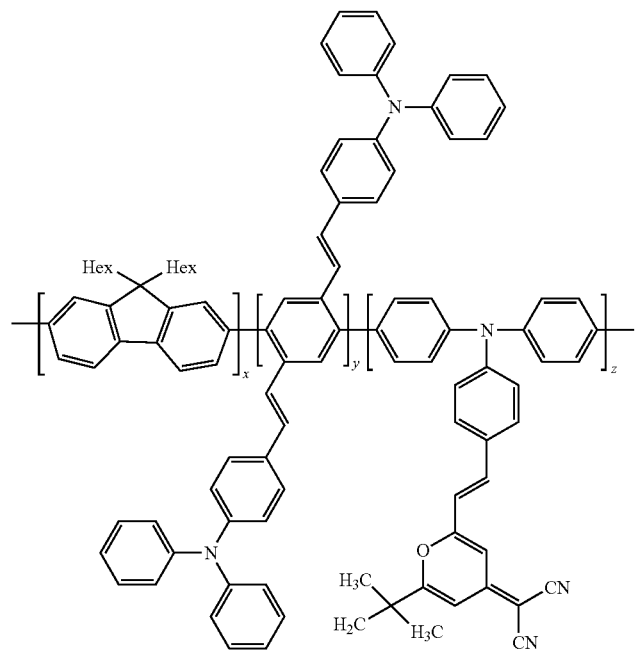
[Formula 5]
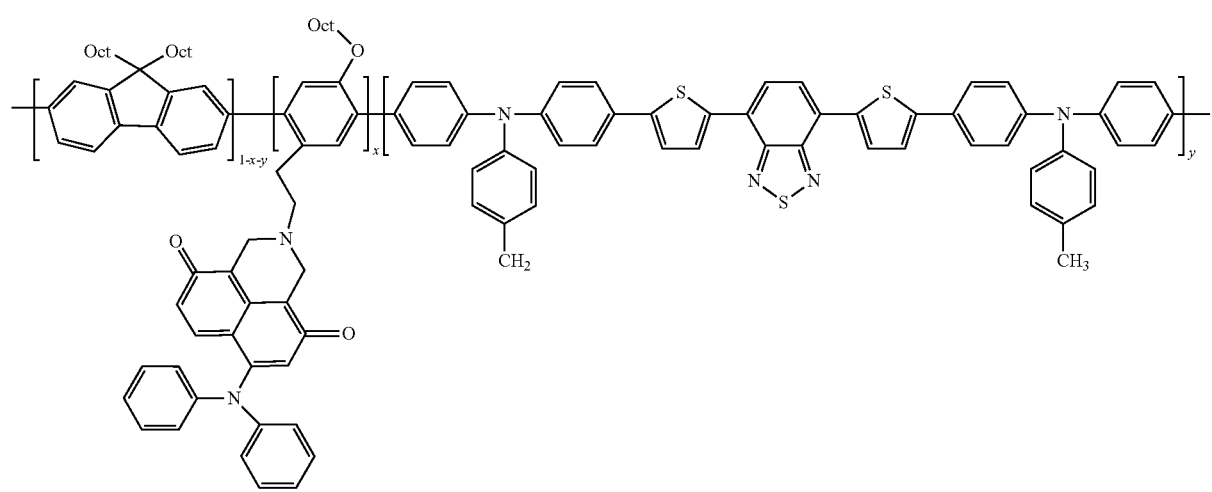

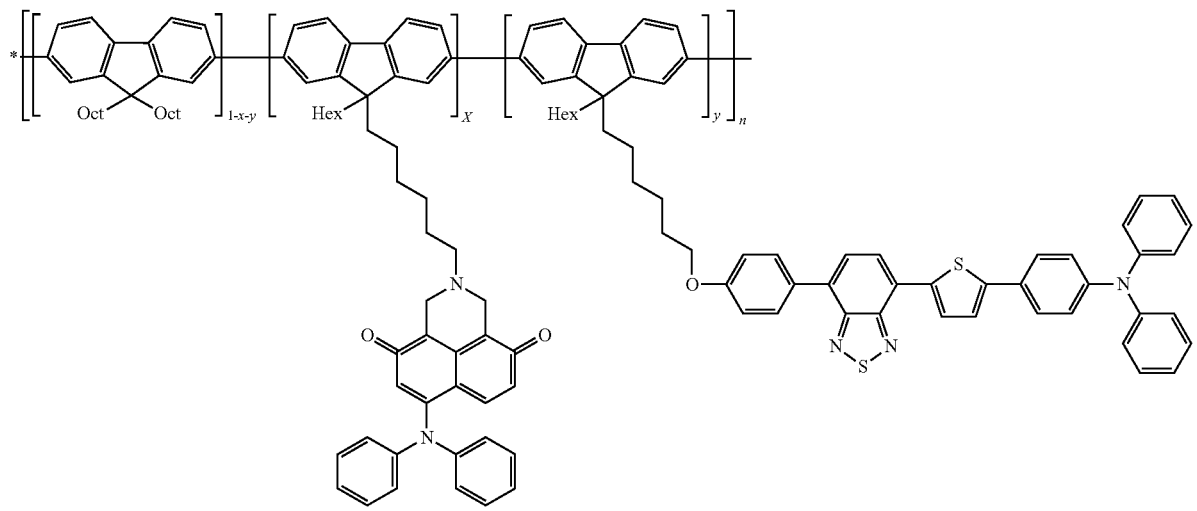
[Formula 6]
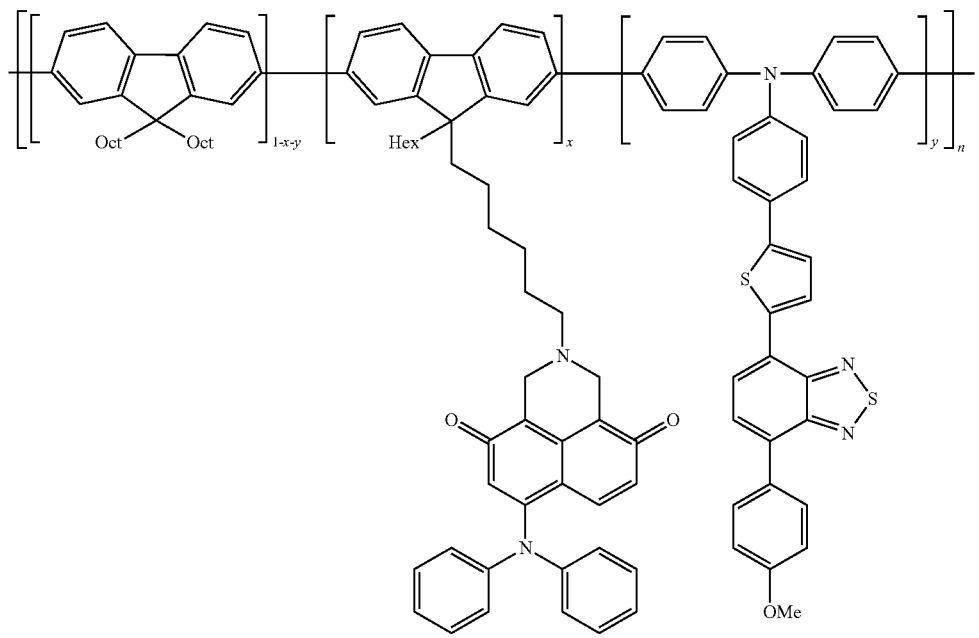
[Formula 7]

[Formula 8]
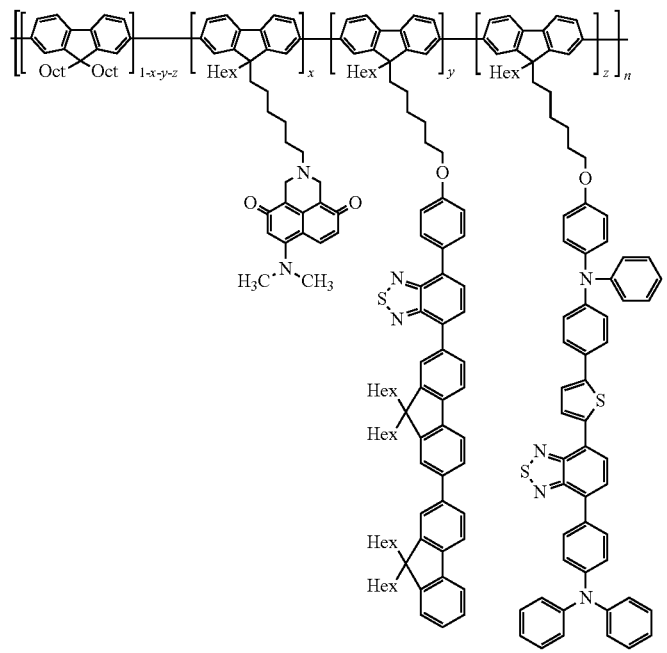
[Formula 9]
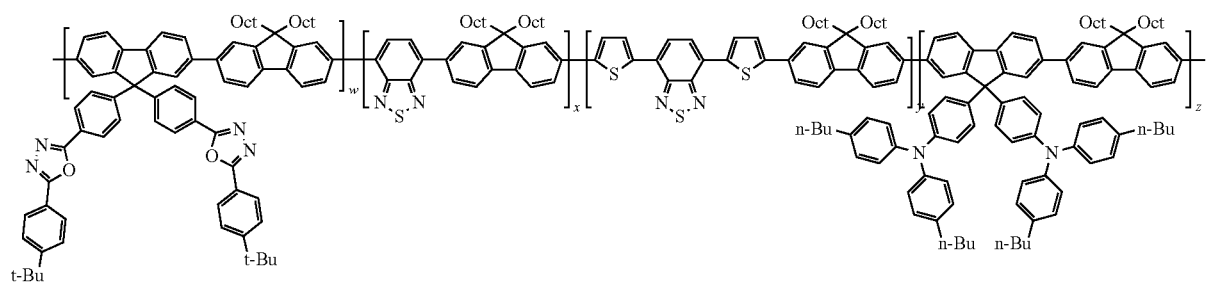
[Formula 10]
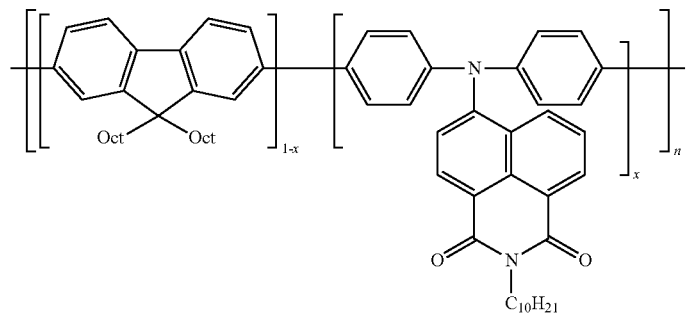
[Formula 11]
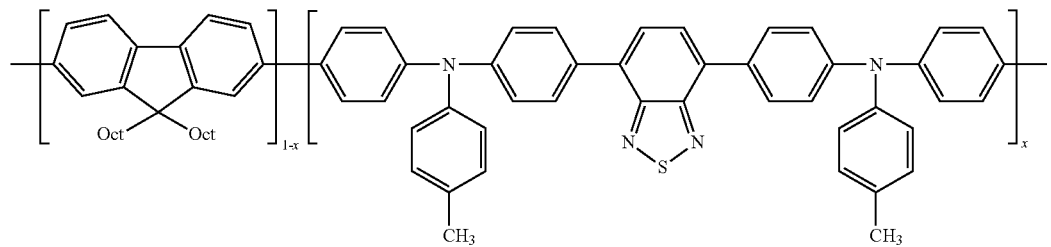

-continued
[Formula 12]
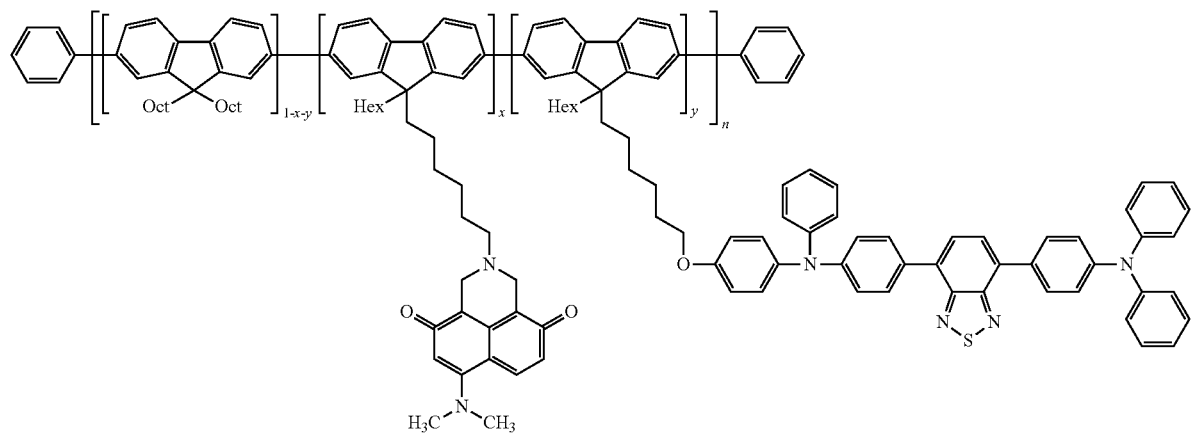
[Formula 13]
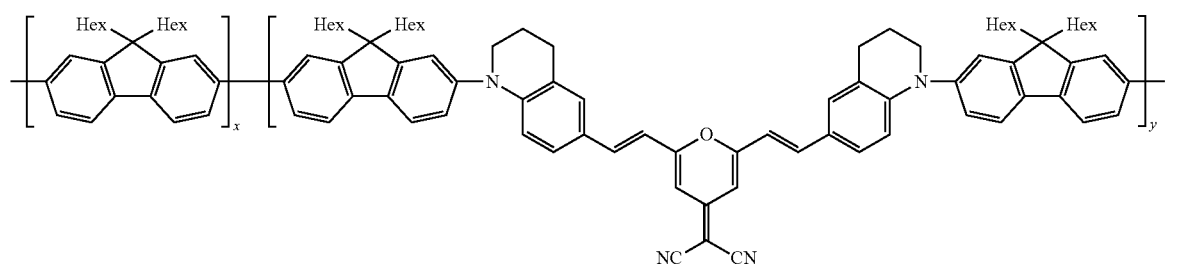
[Formula 14]
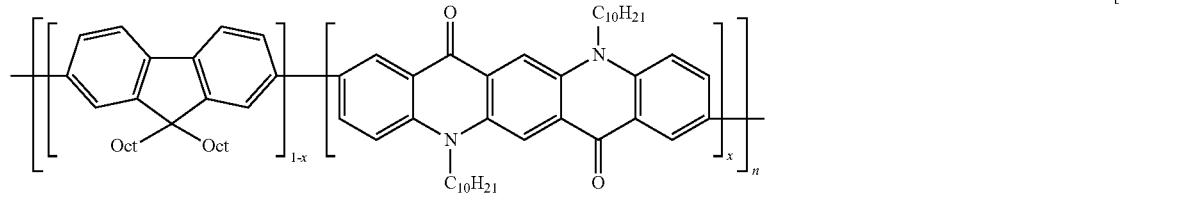
[Formual 15]
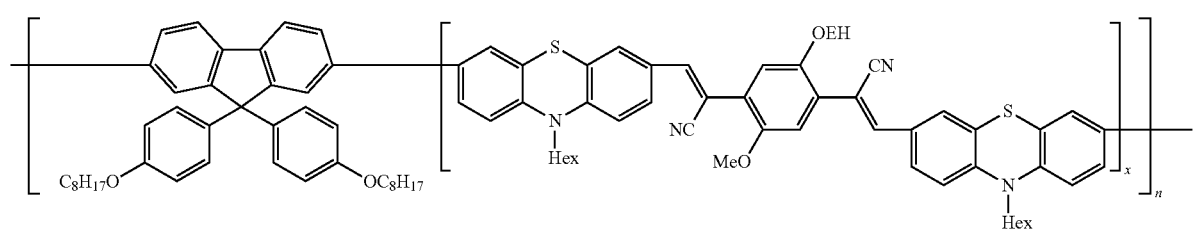
[Formual 16]
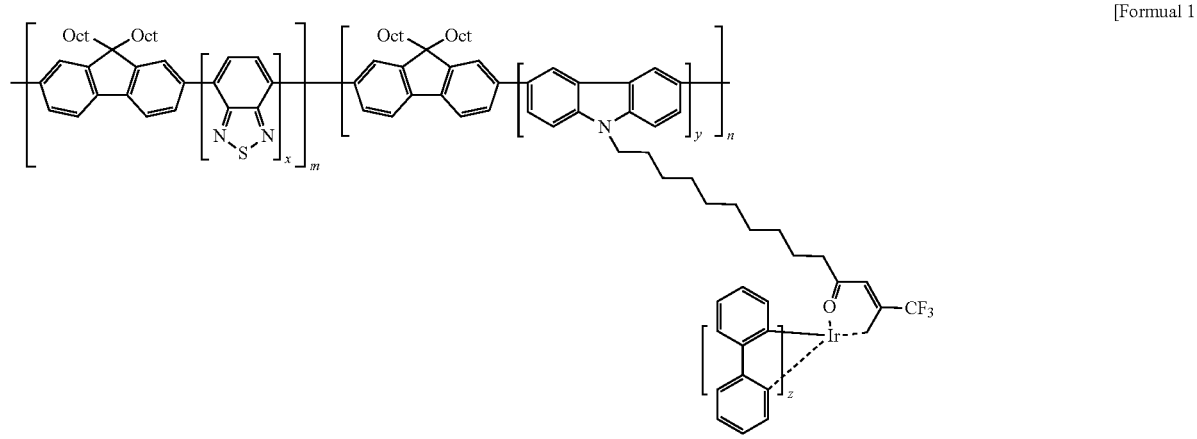

-continued
[Formula 17]
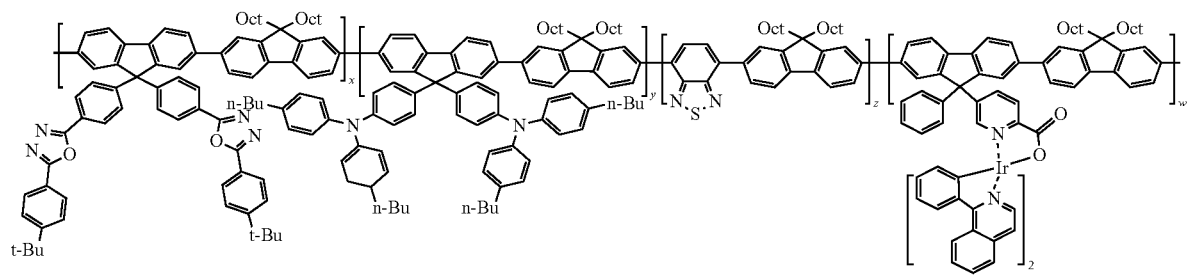
[Formula 18]
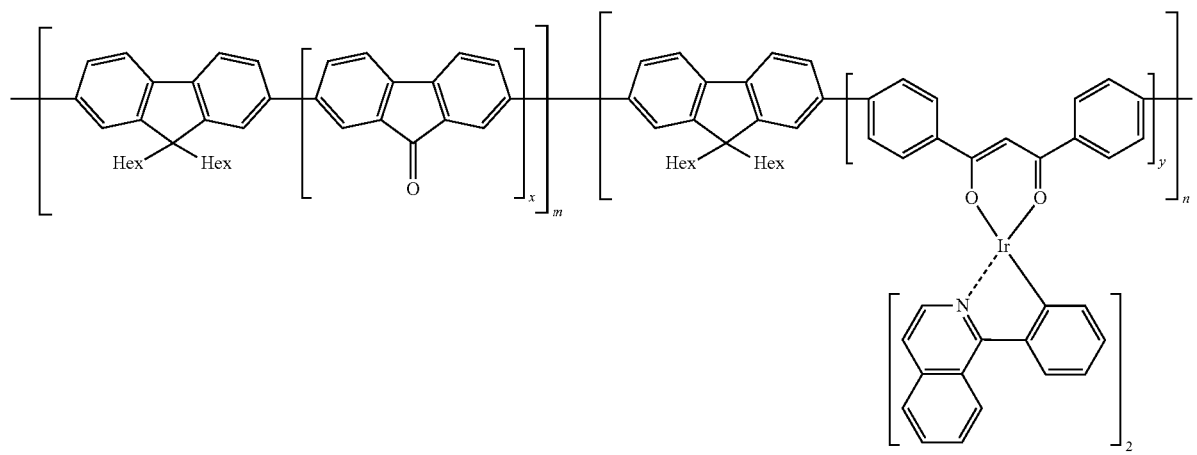
[Formula 19]
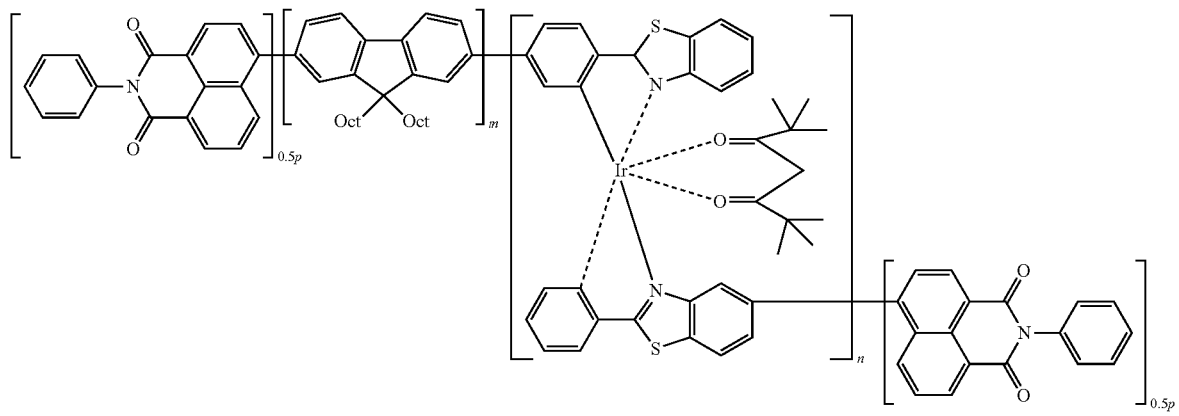
[Formula 20]
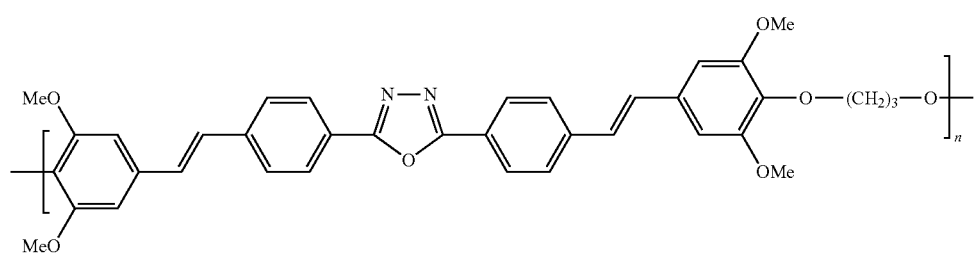

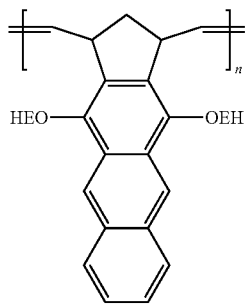

[Formula 21]

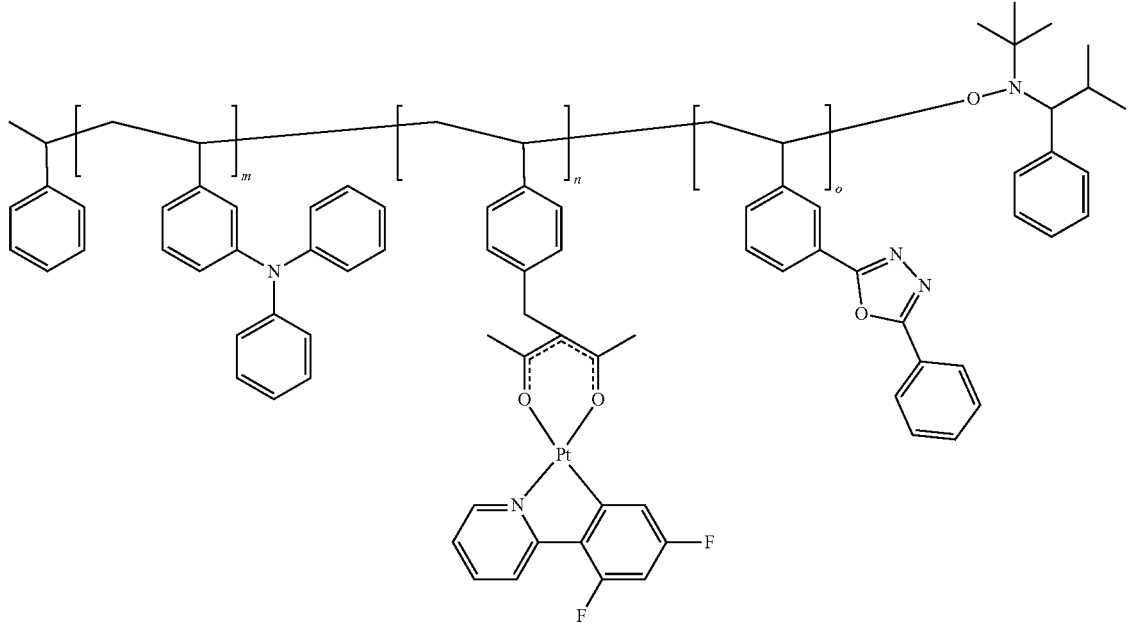

[Formula 22]

Furthermore, the light emitting material layer may be formed by combining two or more types of light emitting materials. As an example, it may be a mixture or blend of a high molecular weight organic material and a low molecular weight organic material. Through this, the light emitting device according to an embodiment of the present invention may emit light in various colors such as blue, green, and red. It can also emit white light.

Figure 7:
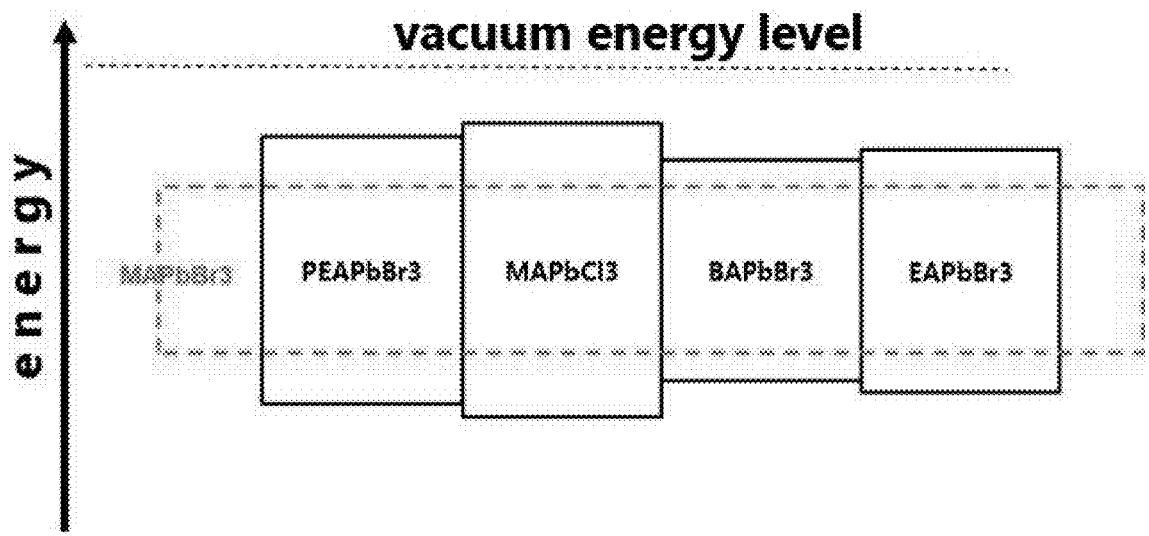
FIG. 7 shows energy levels of materials used in a light emitting layer having a stacked structure in which first light emitting material layers and second light emitting material layers are alternately disposed according to an embodiment of the present invention.

FIG. 7 is a diagram illustrating energy levels of materials used in a light emitting layer having a stacked structure in which a first light emitting material layer and a second light emitting material layer are alternately disposed according to an embodiment of the present invention.

Referring to FIG. 7, the energy level of the valence band maximum (VBM) of the Methylammonium lead bromide ($CH_3NH_3PbBr_3$; $MAPbBr_3$) is (−)5.9, and the energy level of the conduction band minimum (CBM) is (−)3.6.

At this time, in the case of Phenylethylene lead bromide ($PEAPbBr_3$), the energy level of VBM is (−)6.4, which is lower than the energy level of VBM of $MAPbBr_3$, and the energy level of CBM is (−)2.5, which may be higher than the energy level of CBM of $MAPbBr_3$.

Accordingly, when $MAPbBr_3$ is used as the perovskite included in the second light-emitting material layer, $PEAPbBr_3$ may be used as the perovskite included in the first light-emitting material layer. That is, according to the present invention, the light emitting layer having a stacked structure can be manufactured by alternately disposing the first light emitting material layer including $PEAPbBr_3$ and the second light emitting material layer including $MAPbBr_3$.

In particular, when $MAPbBr_3$ is used as the perovskite included in the second light-emitting material layer, Methylammonium lead chloride ($MAPbCl_3$), Butylammonium lead bromide ($BAPbBr_3$) or Ethylammonium lead bromide ($EAPbBr_3$) may also be used as the perovskite included in the first light-emitting material layer, but is not limited thereto.

In addition, a size of A of the first light-emitting material layer may be greater than or equal to the size of A of the second light-emitting material layer, and a size of X of the first light-emitting material layer may be smaller than or equal to the size of the second light-emitting material layer. By using a size difference of A and X, it is possible to control the difference in the band gap between the light emitting material layers. In addition, by using a dimensionality of the crystal structure of the first light emitting material layer that is lower than or equal to the dimensionality of the crystal structure of the second light emitting material layer, a band gap difference between the light emitting material layers may be controlled.

Specifically, the crystal structure of the perovskite may be a three-dimensional (3D), two-dimensional (2D), one-dimensional (1D) or zero-dimensional (0D) crystal structure. As an example, the structure of $ABX_3$ may be a three-dimensional crystal structure, and the structure of $A_2BX_4$ may be a two-dimensional crystal structure. In addition, the structure of $A_3BX_5$ may be a one-dimensional crystal structure, and $A_4BX_6$ may have a zero-dimensional crystal structure.

Therefore, when the crystal structure of the perovskite included in the second light emitting material layer is $ABX_3$, the crystal structure of the perovskite included in the first light emitting material layer may be $A_2BX_4$, $A_3BX_5$, $A_4BX_6$. When the crystal structure of the perovskite included in the second light-emitting material layer is $A_2BX_4$, the crystal structure of the perovskite included in the first light-emitting material layer may be $A_3BX_5$ or $A_4BX_6$. In addition, when the crystal structure of the perovskite included in the second light-emitting material layer is $A_3BX_5$, the crystal structure of the perovskite included in the first light-emitting material layer may be $A_4BX_6$.

Figure 8:
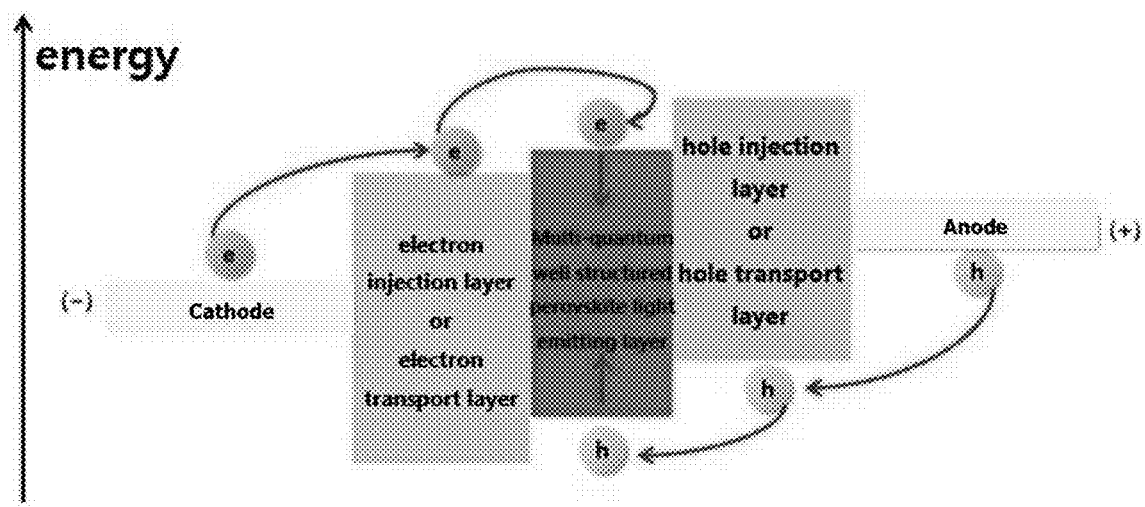
FIG. 8 shows energy levels of constituent layers in a light-emitting device with inverted structure including a light emitting layer according to an embodiment of the present invention.
Figure 9:
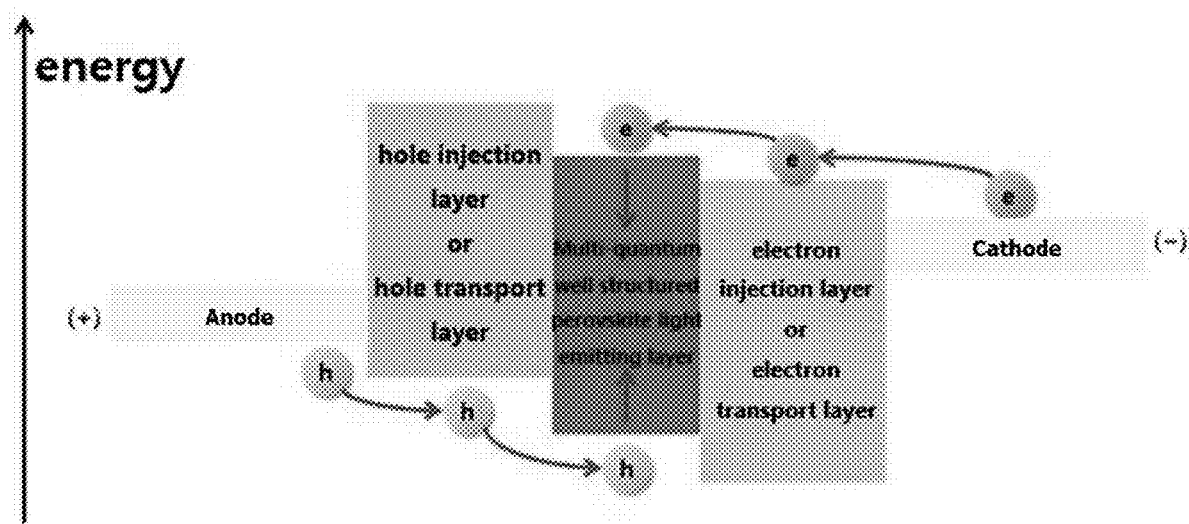
FIG. 9 shows energy levels of constituent layers in a light-emitting device with normal structure including a light emitting layer according to another embodiment of the present invention.

FIG. 8 shows energy levels of constituent layers in an inverted light emitting device including a light emitting layer according to an embodiment of the present invention, and FIG. 9 represents the energy levels of the constituent layers in a normal structure light emitting device including a light emitting layer according to an embodiment of the present invention.

FIG. 8 and FIG. 9, in the light emitting device according to an embodiment of the present invention, the energy level of VBM of the light emitting layer 40 is preferable to be lower than the energy level of HOMO (highest occupied molecular orbital) of the hole injection layer. When having such an energy level, if a forward bias is applied to the light emitting device, holes from the anode 20 are easily introduced into the light emitting layer 40 through the hole injection layer 30 and/or the hole transport layer (not shown). In addition, it is preferable that the energy level of CBM of the light emitting layer is higher than the energy level of LUMO (lowest unoccupied molecular orbital) of the electron transport layer. When having such an energy level, if a forward bias is applied to the light emitting device, electrons from the cathode 70 are easily introduced into the light emitting layer 40 through the electron injection layer 60 and/or the electron transport layer 50. By having such an energy level, electrons and holes introduced into the light emitting layer 40 combine to form excitons, and light may be emitted while the excitons transition to a ground state.

Figure 10:
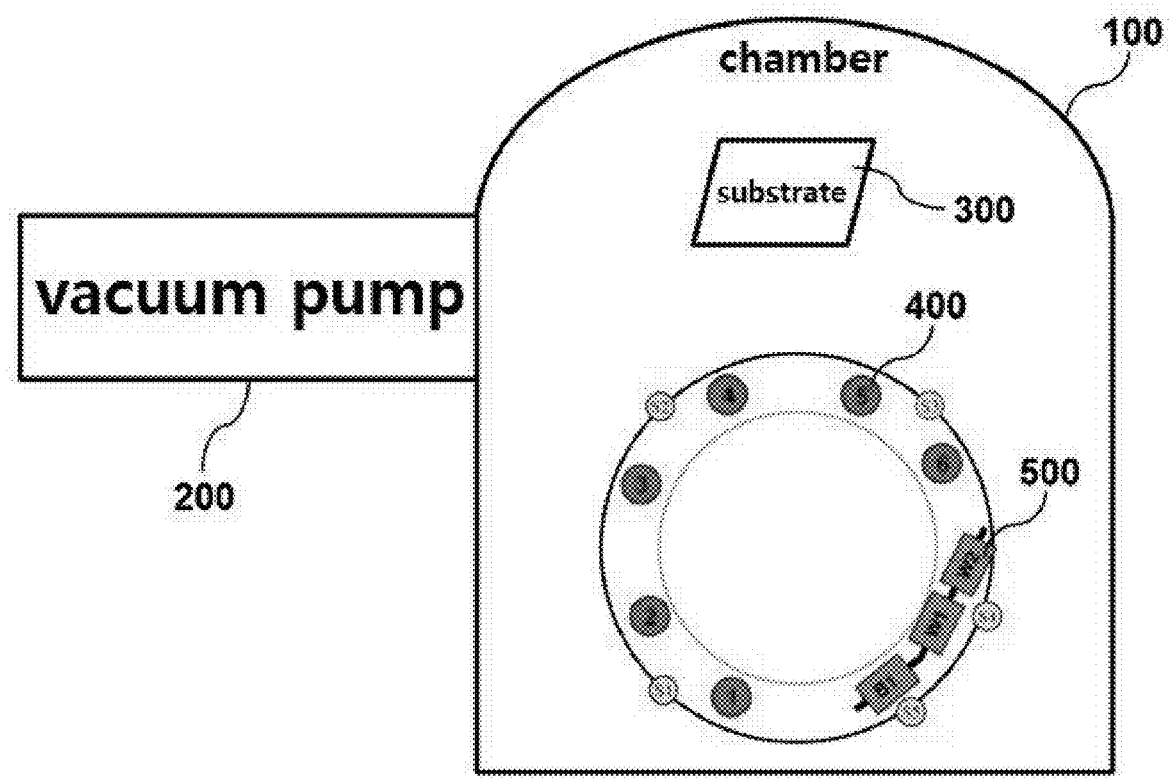
FIG. 10 is a schematic diagram showing the structure of a high vacuum evaporator for manufacturing a light-emitting layer according to an embodiment of the present invention.

FIG. 10 is a schematic diagram showing the structure of a high vacuum evaporator for manufacturing a light emitting layer according to an embodiment of the present invention.

Referring to FIG. 10, the vacuum evaporator includes a chamber 100 and a vacuum pump 200, and a substrate part 300 on which a deposition target substrate is placed in the chamber 100. A crucible containing the perovskite precursor material 400 of the first light emitting material layer and the perovskite precursor material 500 of the second light emitting material layer, a heat source for heating the crucible may be provided under the crucible. In the vacuum deposition method, the substrate 300 is placed on the upper end in the chamber 100 of the vacuum evaporator, and the perovskite precursor material 400 of the first light-emitting material layer and the perovskite precursor material 500 of the second light-emitting material layer are loaded at the lower end. After that, loading the precursor materials and heating each material alternately in a vacuum (sequential deposition) with an electron beam or the like, the vaporized materials are synthesized while being deposited on the substrate to form a perovskite light emitting layer having a multi-quantum well structure.

The light emitting layer according to the present invention may be deposited alternately so that the first light emitting material layer and the second light emitting material layer may be alternately disposed, thereby forming a uniform thin film. By alternately depositing the band gap of the first light emitting material layer having a larger band gap and the second light emitting material layer having a smaller band gap, excitons or charge transporters are spatially confined within the second light emitting material layer having a smaller band gap to improve the luminescence efficiency. In addition, by controlling the energy level through the thickness and the number of stacking of the first light emitting material layer and the second light emitting material layer, it is possible to adjust the light emission wavelength by controlling the degree of energy transfer. Accordingly, the electroluminescence efficiency can be improved by controlling the electron-hole recombination zone of the light emitting device. In addition, white light may be emitted by controlling the energy levels of the first light emitting material layer and the second light emitting material layer.

MODE FOR CARRYING OUT THE INVENTION

Hereinafter, the present invention will be described in detail by examples and experimental examples. However, the following examples and experimental examples are merely illustrative of the present invention, and the contents of the present invention are not limited by the following examples and experimental examples.

Preparation Example 1 of Light-Emitting Devices

First, after preparing an ITO substrate (a glass substrate coated with an ITO anode), PEDOT:PSS (Heraeus, AI4083), a conductive material, is spin-coated on the ITO anode, and heat treatment is performed at 150° C. for 30 minutes to form a hole injection layer having a thickness of 50 nm. Next, in the thermal evaporator as shown in FIG. 7, PEABr and $PbBr_2$ are first deposited on the hole injection layer through thermal deposition in a high vacuum (1×10-7 Torr) to have a first light-emitting material layer with larger band gap and then, MABr and $PbBr_2$ were co-deposited to form a second light-emitting material layer having a smaller band gap. By repeating the above stacked structure, the first light emitting material layer and the second light emitting material layer were alternately disposed to form a perovskite light emitting layer having a stacked structure. Thereafter, 1,3,5-Tris(1-phenyl-1H-benzimidazol-2-yl)benzene (TPBI) having a thickness of 50 nm was deposited on the light emitting layer at a high vacuum of 1×10-6 Torr or less to form an electron transport layer. A light emitting device was manufactured by depositing LiF with a thickness of 1 nm thereon to form an electron injection layer, and then depositing aluminum with a thickness of 100 nm thereon to form a cathode. The fabricated light emitting device exhibited electroluminescence in the $MAPbBr_3$ perovskite layer having a smaller band gap than the $PEAPbBr_3$ perovskite layer, and exhibited the highest luminance of about 8,000 cd/m$^2$ and the highest current efficiency of about 20 cd/A.

Preparation Example 2 of Light-Emitting Devices

First, after preparing an ITO substrate (a glass substrate coated with an ITO anode), PEDOT:PSS (Heraeus, AI4083), a conductive material, is spin-coated on the ITO anode, and heat treatment is performed at 150° C. for 30 minutes to form a hole injection layer having a thickness of 50 nm. Next, in the thermal evaporator as shown in FIG. 7, PEABr and PbBr$_2$ are first deposited on the hole injection layer through thermal deposition in a high vacuum (1×10-7 Torr) to have a first light-emitting material layer with larger band gap and then. organic emitters, C545T, were co-deposited to form a second light-emitting material layer having a smaller band gap. By repeating the above stacked structure, the first light emitting material layer and the second light emitting material layer were alternately disposed to form a perovskite light emitting layer having a stacked structure. Thereafter, 1,3,5-Tris(1-phenyl-1H-benzimidazol-2-yl) benzene (TPBI) having a thickness of 50 nm was deposited on the light emitting layer at a high vacuum of 1×10-6 Torr or less to form an electron transport layer. A light emitting device was manufactured by depositing LiF with a thickness of 1 nm thereon to form an electron injection layer, and then depositing aluminum with a thickness of 100 nm thereon to form a cathode. The fabricated light emitting device exhibited electroluminescence in the C545T organic material layer having a smaller band gap than the PEAPbBr$_3$ perovskite layer, and exhibited the highest luminance of about 6,000 cd/m$^2$ and the highest current efficiency of about 10 cd/A.

Preparation Example 3 of White-Light Emitting Devices

First, after preparing an ITO substrate (a glass substrate coated with an ITO anode), PEDOT:PSS (Heraeus, AI4083), a conductive material, is spin-coated on the ITO anode, and heat treatment is performed at 150° C. for 30 minutes to form a hole injection layer having a thickness of 50 nm. Next, in the thermal evaporator as shown in FIG. 7, PEABr and PbBr$_2$ are first deposited on the hole injection layer through thermal deposition in a high vacuum (1×10-7 Torr) to have a first light-emitting material layer with larger band gap and then, MAI and PbBr$_2$ were co-deposited to form a second light-emitting material layer having a smaller band gap. By repeating the above stacked structure, the first light emitting material layer and the second light emitting material layer were alternately disposed to form a perovskite light emitting layer having a stacked structure. Thereafter, 1,3,5-Tris(1-phenyl-1H-benzimidazol-2-yl)benzene (TPBI) having a thickness of 50 nm was deposited on the light emitting layer at a high vacuum of 1×10-6 Torr or less to form an electron transport layer. A light emitting device was manufactured by depositing LiF with a thickness of 1 nm thereon to form an electron injection layer, and then depositing aluminum with a thickness of 100 nm thereon to form a negative electrode. The fabricated light emitting device exhibited white electroluminescence both in the PEAPbBr$_3$ (blue emission) and MAPbIBr$_2$ having a smaller bandgap, and exhibited the highest luminance of about 3,000 cd/m$^2$ and the highest current efficiency of about 5 cd/A.

On the other hand, the embodiments of the present invention disclosed in the specification and figures are only presented as specific examples to aid understanding, and are not intended to limit the scope of the present invention. In addition to the embodiments disclosed herein, it is obvious to those of ordinary knowledge in the field that other modified examples based on the technical idea of the present invention can be implemented

The invention claimed is:

1. A light-emitting device comprising:
    an anode;
    a cathode;
    stacked light-emitting layers disposed between the anode and the cathode; and
    a hole injection layer disposed between the anode and the stacked light-emitting layers, or an electron transport layer disposed between the stacked light-emitting layers and the cathode,
    wherein the stacked light-emitting layers comprise alternately disposed light-emitting material layers having different band gaps, wherein a first light-emitting material layer is a perovskite layer, and a second light-emitting material layer is either an organic light-emitting layer or a perovskite light-emitting layer, and
    wherein a valence band maximum (VBM) energy level of the stacked light-emitting layers is lower than a work function of the anode and lower than a highest occupied molecular orbital (HOMO) energy level of the hole injection layer.

2. The light-emitting device of claim 1,
    wherein the stacked light-emitting layers comprise at least two organic light-emitting materials, and
    wherein the organic light-emitting materials comprise a mixture or blend of a high molecular weight organic material and a low molecular weight organic material.

3. The light-emitting device of claim 1,
    wherein the perovskite included in the first light emitting layer or the second light emitting layer has a structure of $ABX_3$, $A_2BX_4$, $A_3BX_5$, $A_4BX_6$, $ABX_4$ or $A_{n-1}Pb_nX_{3n+1}$ (where n is an integer between 2 to 6), and
    the A comprises an organic ammonium, an organic amidinium, an organic phosphonium, an alkali material or a combination thereof,
    the B comprises a transition metal, a rare earth metal, an alkali earth metal, an organic materials, an inorganic materials, ammonium, a derivative or a combination thereof,
    the X comprises a halogen ion or a combination of different halogen ions.

4. The light-emitting device of claim 3,
    wherein the size of A of the first light emitting material layer is greater than or equal to the size of A of the second light emitting material layer.

5. The light-emitting device of claim 3,
    wherein the size of X of the first light emitting material layer is smaller than or equal to the size of X of the second light emitting material layer.

6. The light-emitting device of claim 3,
    wherein the dimensionality of a crystal structure of the first light emitting material layer is lower than or equal to the dimensionality of a crystal structure of the second light emitting material layer.

7. The light-emitting device of claim 3,
    wherein the A comprises $(CH_3NH_3)_n$, $((C_xH_{2x+1})_nNH_2)(CH_3NH_3)_n$, $R(NH_2)_2$ (where R is alkyl or fluoroalkyl), $(C_xH_{2x+1}NH_3)_2$, $(CF_3NH_3)$, $(CF_3NH_3)_n$, $((C_xF_{2x+1})_nNH_2)$ $(CF_2NH_3)_n$, $((C_xF_{2x+1})_nNH_3)$, $(C_nF_{2n+1}NH_3)$ (where n and x is an integer equal to or greater than 1) or derivatives thereof, metal, Na, K, Rb, Cs, Fr, combinations thereof, or derivatives thereof,
    the B comprises Pb, Mn, Cu, Ga, Ge, In, Al, Sb, Bi, Po, Sn, Eu, Yb, Ni, Co, Fe, Cr, Pd, Cd, Ca, Sr, an organic ammonium, an inorganic ammonium, an organic cation, a combination thereof or a derivative thereof
    the X comprises Cl, Br, I, or a combination thereof.

8. A light-emitting device comprising:
    an anode;
    a cathode;
    stacked light-emitting layers disposed between the anode and the cathode; and a hole injection layer disposed between the anode and the stacked light-emitting layers, or an electron transport layer disposed between the stacked light-emitting layers and the cathode, wherein the stacked light-emitting layers comprise alternately disposed light-emitting material layers having different band gaps, wherein a first light-emitting material layer is a perovskite layer, and a second light-emitting material layer is either an organic light-emitting layer or a perovskite light-emitting layer, and wherein a conduction band minimum (CBM) energy level of the stacked light-emitting layers is higher than a work function of the cathode and higher than a lowest unoccupied molecular orbital (LUMO) energy level of the electron transport layer.

9. The light-emitting device of claim 8, wherein the stacked light-emitting layers comprise at least two organic light-emitting materials, and wherein the organic light-emitting materials comprise a mixture or blend of a high molecular weight organic material and a low molecular weight organic material.

10. The light-emitting device of claim 2, wherein the perovskite included in the first light emitting layer or the second light emitting layer has a structure of $ABX_3$, $A_2BX_4$, $A_3BX_5$, $A_4BX_6$, $ABX_4$ or $A_{n-1}Pb_nX_{3n+1}$ (where n is an integer between 2 to 6), and the A comprises an organic ammonium, an organic amidinium, an organic phosphonium, an alkali material or a combination thereof, the B comprises a transition metal, a rare earth metal, an alkali earth metal, an organic materials, an inorganic materials, ammonium, a derivative or a combination thereof, the X comprises a halogen ion or a combination of different halogen ions.

11. A method of manufacturing a light-emitting device, comprising:

forming an anode on a substrate;

forming a stacked light-emitting layer on the anode by alternately disposing at least a first light-emitting material layer and a second light-emitting material layer using a deposition method; and forming a cathode on the stacked light-emitting layer, wherein the first light-emitting material layer comprises a perovskite, and the second light-emitting material layer comprises either a perovskite or an organic material, and the first and second light-emitting material layers have different band gaps, and wherein a valence band maximum (VBM) energy level of the stacked light-emitting layer is lower than a work function of the anode, and a conduction band minimum (CBM) energy level of the stacked light-emitting layer is higher than a work function of the cathode.

12. A method of manufacturing a light-emitting device, comprising:

forming an anode on a substrate;

forming a hole injection layer on the anode;

forming a stacked light-emitting layer on the hole injection layer by alternately disposing at least a first light-emitting material layer and a second light-emitting material layer using a deposition method;

forming an electron transport layer on the stacked light-emitting layer; and forming a cathode on the electron transport layer, wherein the first light-emitting material layer comprises a perovskite, the second light-emitting material layer comprises either a perovskite or an organic material, and the first and second light-emitting material layers have different band gaps, and wherein a valence band maximum (VBM) energy level of the stacked light-emitting layer is lower than a work function of the anode and lower than a highest occupied molecular orbital (HOMO) energy level of the hole injection layer, and wherein a conduction band minimum (CBM) energy level of the stacked light-emitting layer is higher than a work function of the cathode and higher than a lowest unoccupied molecular orbital (LUMO) energy level of the electron transport layer.

* * * * *